(12) United States Patent
Kawaguchi et al.

(10) Patent No.: US 9,036,673 B2
(45) Date of Patent: May 19, 2015

(54) SEMICONDUCTOR LASER

(71) Applicant: Fujitsu Limited, Kawasaki-shi, Kanagawa (JP)

(72) Inventors: Kenichi Kawaguchi, Ebina (JP); Yoshiaki Nakata, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/309,130

(22) Filed: Jun. 19, 2014

(65) Prior Publication Data

US 2014/0301420 A1    Oct. 9, 2014

Related U.S. Application Data

(63) Continuation of application No. PCT/JP2012/054740, filed on Feb. 27, 2012.

(51) Int. Cl.
| | | |
|---|---|---|
| *H01S 5/00* | (2006.01) | |
| *H01S 5/20* | (2006.01) | |
| *H01S 5/183* | (2006.01) | |
| *H01S 5/34* | (2006.01) | |
| *B82Y 20/00* | (2011.01) | |
| *H01S 5/10* | (2006.01) | |
| *H01S 5/343* | (2006.01) | |

(52) U.S. Cl.
CPC .............. *H01S 5/2027* (2013.01); *H01S 5/1042* (2013.01); *H01S 5/18341* (2013.01); *H01S 5/1835* (2013.01); *H01S 5/18369* (2013.01); *H01S 5/3428* (2013.01); *H01S 5/34306* (2013.01); *B82Y 20/00* (2013.01); *Y10S 977/951* (2013.01)

(58) Field of Classification Search
CPC ............................. H01S 5/2027; H01S 5/3401
USPC ...................................................... 372/45.012
See application file for complete search history.

(56) References Cited

U.S. PATENT DOCUMENTS 6,965,626 B2 * 11/2005 Tatum et al. ..................... 372/87
7,521,274 B2 * 4/2009 Hersee et al. ..................... 438/41
(Continued)

FOREIGN PATENT DOCUMENTS

| JP | 08-8375 | 1/1996 |
| JP | 10-321910 | 12/1998 |
| JP | 2006-303508 | 11/2006 |

(Continued)

OTHER PUBLICATIONS

International Search Report, mailed in connection with PCT/JP2012/054740 and mailed Apr. 3, 2012.

*Primary Examiner* — Tod T Van Roy
*Assistant Examiner* — Vu A Vu
(74) *Attorney, Agent, or Firm* — Fujitsu Patent Center

(57) ABSTRACT

A semiconductor laser includes a semiconductor nanowire of a first conductivity type provided over a substrate, a light emitting layer provided around the semiconductor nanowire and insulated at an upper end and a lower end thereof, a cladding layer of a second conductivity type different from the first conductivity type, the cladding layer being provided at an outer periphery of the light emitting layer, a first electrode electrically coupled to an end portion of the semiconductor nanowire, a second electrode electrically coupled to an outer periphery of the cladding layer, a first reflection mirror provided at a one-end portion side of the semiconductor nanowire, and a second reflection mirror provided at the other end portion side of the semiconductor nanowire.

17 Claims, 20 Drawing Sheets

(56) References Cited

U.S. PATENT DOCUMENTS 7,830,938 B2 * 11/2010 Rossin ................. 372/45.01
2007/0057248 A1    3/2007 Yao et al.
2008/0036038 A1    2/2008 Hersee et al.
2012/0235117 A1 *  9/2012 Fukui et al. ............... 257/13

FOREIGN PATENT DOCUMENTS

| JP | 2009-542560 | | 12/2009 | |
|---|---|---|---|---|
| JP | WO2011067872 | * | 9/2011 | ............ 257/13 |
| WO | 2008/048704 | | 4/2008 | |
| WO | 2011/067872 | | 6/2011 | |

* cited by examiner

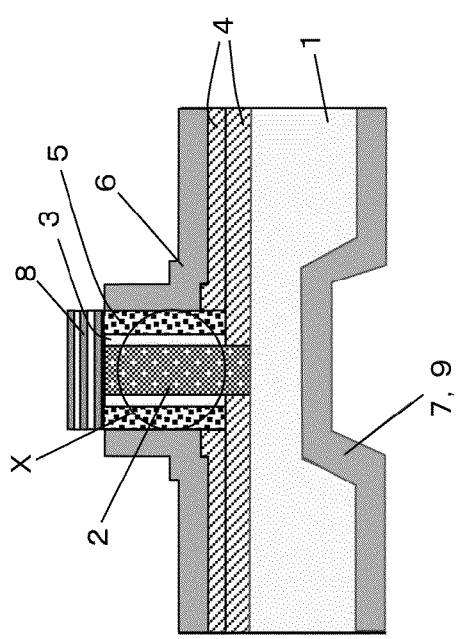
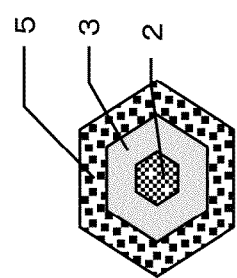
FIG. 1A
FIG. 1B

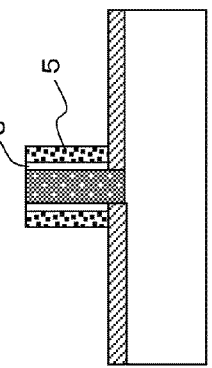
FIG. 12C
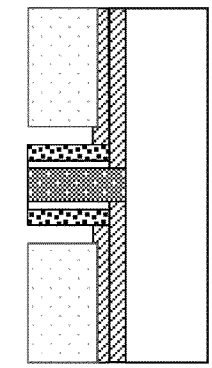
FIG. 12F
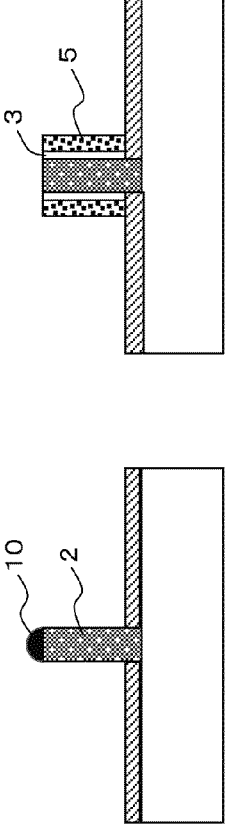
FIG. 12B
FIG. 12E
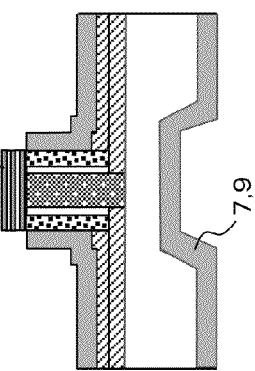
FIG. 12H
FIG. 12A
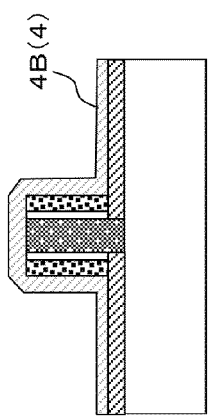
FIG. 12D
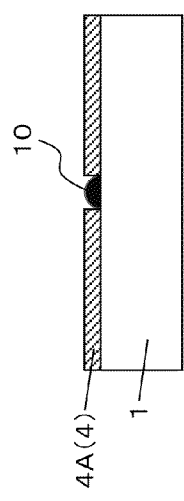
FIG. 12G United States Patent US 9,036,673 B2

SEMICONDUCTOR LASER

CROSS-REFERENCE TO RELATED APPLICATION

This application is a continuation application of International Application PCT/JP2012/054740, filed on Feb. 27, 2012 and designated the U.S., the entire contents of which are incorporated herein by reference.

FIELD

The embodiments discussed herein are related to a semiconductor laser.

BACKGROUND

In recent years, a very small laser light source that allows downsizing of an apparatus and high-density integration and has a good light emission characteristic is demanded.

On the other hand, a semiconductor nanowire formed in a bottom-up design has good crystallinity, and therefore, application thereof to nanodevices is expected.

For example, it seems a possible idea to interpose, in a semiconductor nanowire 100, a light emitting layer 102 extending in a direction parallel to the front face of a substrate 101 (in a substrate in-plane direction) as depicted in FIG. 20 to implement a very small semiconductor laser. This is hereinafter referred to as first technology.

Also it seems a possible idea, for example, to provide a light emitting layer extending in a direction perpendicular to the front face of a substrate on a semiconductor nanowire, namely, to provide a light emitting layer around a semiconductor nanowire, to implement a very small semiconductor laser. This is hereinafter referred to as second technology.

SUMMARY

According to an aspect of the embodiment, a semiconductor laser includes a semiconductor nanowire of a first conductivity type provided over a substrate, a light emitting layer provided around the semiconductor nanowire and insulated at an upper end and a lower end thereof, a cladding layer of a second conductivity type different from the first conductivity type, the cladding layer being provided at an outer periphery of the light emitting layer, a first electrode electrically coupled to an end portion of the semiconductor nanowire, a second electrode electrically coupled to an outer periphery of the cladding layer, a first reflection mirror provided at a one-end portion side of the semiconductor nanowire, and a second reflection mirror provided at the other end portion side of the semiconductor nanowire.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 1A and 1B are schematic views depicting a configuration of a semiconductor laser according to an embodiment, wherein FIG. 1A is a sectional view taken along an extending direction of a semiconductor nanowire and FIG. 1B is a sectional view of a portion indicated by reference character X in FIG. 1A taken along a direction orthogonal to the extending direction of the semiconductor nanowire;

FIGS. 12A to 12H are schematic sectional views illustrating a fabrication method for the semiconductor laser according to the present embodiment;

DESCRIPTION OF EMBODIMENTS

Figure 2A:
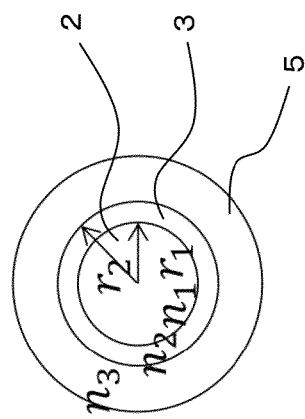
FIG. 2A is a schematic view depicting an optical electrical field intensity distribution in an optical confinement state of a mode I in a semiconductor nanowire, a light emitting layer and a cladding layer configuring the semiconductor laser according to the present embodiment.

However, since the first technology described above fails to achieve a sufficient gain, it is difficult to implement a laser.

Further, it is difficult to implement a very small semiconductor laser having a good light emission characteristic only if the light emitting layer is provided simply around the semiconductor nanowire in the second technology described above. For example, if an end port ion of the light emitting layer contacts with and is electrically coupled to a substrate that functions as an electrode, then since recoupling of carriers is concentrated in the proximity of the substrate interface, it is difficult to implement a very small semiconductor laser having a good light emission characteristic.

Therefore, it is demanded to implement a very small semiconductor laser having a good light emission characteristic.

In the following, a semiconductor laser according to an embodiment of the present invention is described below with reference to FIGS. 1A to 12H of the drawings.

The semiconductor laser according to the present embodiment is a semiconductor laser of a very small in-plane size in which a semiconductor nanowire having a diameter of, for example, approximately 10 μm or less is used. Therefore, the semiconductor laser according to the present embodiment is suitable for downsizing and high-density integration of an apparatus. It is to be noted that the semiconductor laser is hereinafter referred to also as nanowire laser or semiconductor nanowire laser.

In particular, as depicted in FIGS. 1A and 1B, the present semiconductor laser includes a substrate 1, a semiconductor nanowire 2, a light emitting layer 3, an insulating film 4, a cladding layer 5, a p-side electrode 6, an n-side electrode 7, an upper reflection mirror 8 and a lower reflection mirror 9.

Here, the substrate 1 is a semiconductor substrate having a first conductivity type, namely, a conductive semiconductor substrate. Here, the substrate 1 is an n-type semiconductor substrate. In particular, the substrate 1 is an n-type GaAs substrate.

The semiconductor nanowire 2 is a semiconductor nanowire of the first conductivity type, namely, a conductive semiconductor nanowire, provided on the substrate 1 and extending in a perpendicular direction to the front face of the substrate 1 (in a vertical direction). Here, the semiconductor nanowire 2 is an n-type semiconductor nanowire provided vertically on the n-type semiconductor substrate 1. Therefore, a lower end portion of the semiconductor nanowire 2 contacts with the front face of the substrate 1. In particular, the semiconductor nanowire 2 is an n-type GaAs nanowire. In this manner, a semiconductor material configuring the semiconductor nanowire 2 includes GaAs.

It is to be noted that, where the entirety of the semiconductor nanowire 2 and the light emitting layer 3 and cladding layer 5 provided around the semiconductor nanowire 2 is regarded as a nanowire, the semiconductor nanowire is referred to also as nanowire core. In this case, since each of the components just described is configured from a semiconductor layer, the semiconductor nanowire 2, light emitting layer 3 and cladding layer 5 are referred to also as first semiconductor layer, second semiconductor layer and third semiconductor layer, respectively. Further, since the semiconductor nanowire 2 and the cladding layer 5 are individually configured from a conductive semiconductor material, each of them is referred to as conductive semiconductor layer.

The insulating film 4 is provided on the front face of the substrate 1 and contacts with part of a side face of the semiconductor nanowire 2 while a lower end portion of the light emitting layer 3 contacts with part of the front face of the insulating film 4. Therefore, the lower end of the light emitting layer 3 is insulated by the insulating film 4. It is to be noted that, in the present embodiment, also a lower end portion of the cladding layer 5 contacts with part of the front face of the insulating film 4.

The light emitting layer 3 is a semiconductor light emitting layer of a cylindrical shape provided around the semiconductor nanowire 2. In particular, the light emitting layer 3 extends in a perpendicular direction to the front face of the substrate 1 along the side face of the semiconductor nanowire 2 and contacts with and covers the side face (side wall) of the semiconductor nanowire 2. Here, the light emitting layer 3 covers a region of the side face of the semiconductor nanowire 2 other than the region covered with the insulating film 4. In other words, the light emitting layer 3 is provided so as to cover part of the side face of the semiconductor nanowire 2. More particularly, the light emitting layer 3 is an InGaAs light emitting layer. In this manner, a semiconductor material configuring the light emitting layer 3 includes InGaAs.

The cladding layer 5 is a conductive semiconductor cladding layer configured from a semiconductor material of a second conductivity type different from the first conductivity type, and is a cylindrical semiconductor cladding layer provided at the outer periphery of the light emitting layer 3. In particular, the cladding layer 5 extends in a direction perpendicular to the front face of the substrate 1 along the side face of the light emitting layer 3 and contacts with and covers the side face (side wall) of the light emitting layer 3. Here, the cladding layer 5 is a p-type semiconductor cladding layer. More particularly, the cladding layer 5 is a p-type AlGaAs cladding layer. In this manner, the semiconductor material configuring the cladding layer 5 includes AlGaAs.

The p-side electrode 6 is a metal electrode and is provided on the outer periphery of the cladding layer 5. In particular, the p-side electrode 6 is electrically coupled to the outer periphery of the cladding layer 5. Here, the p-side electrode 6 is provided on the insulating film 4 and extends in a direction perpendicular to the front face of the substrate 1 along the side face of the cladding layer 5, and contacts with and covers the side face of the cladding layer 5. In the present embodiment, the p-side electrode 6 covers a region of the side face of the cladding layer 5 other than the region covered with the insulating film 4. In other words, the p-side electrode 6 is provided so as to cover part of the side face of the cladding layer 5. It is to be noted that the p-side electrode 6 is referred to also as second electrode. Further, since the p-side electrode 6 is formed from a metal film on the insulating film 4 and the cladding layer 5, this is referred to also as metal electrode film or metal electrode layer.

The upper reflection mirror 8 is a multilayer film reflection mirror covering an upper end portion of the semiconductor nanowire 2, an upper end portion of the light emitting layer 3 and an upper end portion of the cladding layer 5. In particular, the upper reflection mirror 8 is a dielectric multilayer film reflection mirror. Consequently, the semiconductor laser can oscillate with lower threshold current. Further, by setting the reflectance of the upper reflection mirror 8 lower than the reflectance of the lower reflection mirror 9 hereinafter described, laser light can be extracted from an upper face thereof. In this case, the upper end of the light emitting layer 3 is insulated by the dielectric multilayer film reflection mirror 8. Further, the upper reflection mirror 8 is provided at the upper end portion side of the semiconductor nanowire 2, namely, at the tip end side of the semiconductor nanowire 2. It is to be noted that the upper reflection mirror 8 is referred to also as first reflection mirror.

It is to be noted that, where a condition of a mode I in which the electric field of light hereinafter described is confined in the semiconductor nanowire 2 and the light emitting layer 3 is satisfied, the upper reflection mirror 8 may be provided at least over the upper end portion of the semiconductor nanowire 2 and the upper end portion of the light emitting layer 3. On the other hand, where another condition of a mode II in which the electric field of light hereinafter described is confined in the light emitting layer is satisfied, the upper reflection mirror 8 may be provided at least over the end portion of the light emitting layer 3. In this manner, the upper reflection mirror 8 may be provided at least over the upper end portion of the light emitting layer 3.

The n-side electrode 7 and the lower reflection mirror 9 are configured from a metal film provided on the back face of the substrate 1. In particular, the metal film provided on the back face of the substrate 1 functions as an n-side electrode and a lower reflection mirror. Therefore, the n-side electrode 7 is a metal electrode. Here, since the n-type semiconductor nanowire 2 is provided on the n-type semiconductor substrate 1 as described hereinabove, the n-side electrode 7 is electrically coupled to a lower end portion of the n-type semiconductor nanowire 2 through the n-type semiconductor substrate 1. It is to be noted that the n-side electrode 7 is referred to also as first electrode. Further, the lower reflection mirror 9 is a metal film reflection mirror. It is to be noted that the lower reflection mirror 9 is provided at the lower end portion side of the semiconductor nanowire 2, namely, at the substrate side of the semiconductor nanowire 2. It is to be noted that the lower reflection mirror 9 is referred to also as second reflection mirror.

It is to be noted that, where the condition of the mode I in which the electric field of light hereinafter described is confined in the semiconductor nanowire 2 and the light emitting layer 3 is satisfied, the lower reflection mirror 9 may be provided at least under a lower end portion of the semiconductor nanowire 2 and a lower end portion of the light emitting layer 3. On the other hand, where the condition of the mode II in which the electric field of light hereinafter described is confined in the light emitting layer 3 is satisfied, the lower reflection mirror 9 may be provided at least under the lower end portion of the light emitting layer 3. In this manner, the lower reflection mirror 9 may be provided at least under the lower end portion of the light emitting layer 3.

Particularly, it is possible to obtain a favorable laser characteristic by setting the reflectance of the upper reflection mirror 8 and the lower reflection mirror 9 to approximately 95% or more and setting the length of the semiconductor nanowire 2 to approximately 1 μm or more. Further, while a more favorable laser characteristic can be obtained as the length of the semiconductor nanowire 2 increases, it is preferable to set the length of the semiconductor nanowire 2 to approximately 10 μm or less in order for the semiconductor nanowire 2 to have sufficient mechanical strength. In other words, it is preferable to configure the upper reflection mirror 8 and the lower reflection mirror 9 so as to have a reflectance of 95% or more and configure the semiconductor nanowire 2 so as to have a length of 1 μm or more but 10 μm or less.

Incidentally, in the present embodiment, the n-type semiconductor nanowire 2, p-type cladding layer 5 and light emitting layer 3 sandwiched by them extend in the perpendicular direction to the front face of the substrate 1 as described hereinabove. Further, the light emitting layer 3 provided around the semiconductor nanowire 2 is insulated at the upper end and the lower end thereof. Especially, while the semiconductor nanowire 2 contacts with the n-type semiconductor substrate 1, the lower end portion of the light emitting layer 3 contacts with the front face of the insulating film 4 but does not contact with the n-type semiconductor substrate 1. Consequently, current can be injected uniformly into the light emitting layer 3. In other words, a favorable current injection structure can be implemented using the semiconductor nanowire 2. Consequently, a very small semiconductor laser having a favorable light emission characteristic (output) can be implemented.

Further, in the present embodiment, by combining such a favorable light confinement structure as hereinafter described with such a very small semiconductor laser having a favorable current injection structure as described hereinabove, a very small semiconductor laser having a more favorable light emission characteristic is implemented.

Figure 2B:
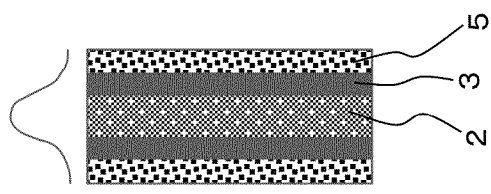
FIG. 2B is a schematic view depicting a size and a refractive index of the semiconductor nanowire, light emitting layer and cladding layer.

First, where the refractive index of the semiconductor material configuring the semiconductor nanowire 2, the refractive index of the semiconductor material configuring the light emitting layer 3 and the refractive index of the semiconductor material configuring the cladding layer 5 are represented by $n_1$, $n_2$ and $n_3$ as depicted in FIG. 2B, respectively, the present semiconductor laser is configured such that a relationship of $n_3 < n_1 < n_2$ is satisfied. Consequently, the semiconductor laser having a favorable light confinement structure is implemented.

Further, in order to implement a semiconductor laser having a more favorable light confinement structure, a condition for implementing an optical confinement state in which light is confined in the semiconductor nanowire 2 and the light emitting layer 3 in the present semiconductor laser as depicted in an optical electric field intensity distribution of FIG. 2A has been found. Such an optical confinement state as just described is hereinafter referred to as mode I and the condition just described is hereinafter referred to as condition of the mode I.

Here, light is confined more as the refractive index difference between the semiconductor material configuring the semiconductor nanowire 2 and the semiconductor material configuring the light emitting layer 3 increases. Therefore, light is confined more as the variation ratio $\Delta n = (n_2 - n_1)/n_1$ of the refractive index $n_2$ of the semiconductor material configuring the light emitting layer 3 with respect to the refractive index $n_1$ of the semiconductor material configuring the semiconductor nanowire 2 increases.

Further, light is confined more as the thickness of the light emitting layer 3 increases. Therefore, where the radius of the semiconductor nanowire 2 and the distance from the center of the semiconductor nanowire 2 to the outer peripheral face (outer wall) of the light emitting layer 3 are represented by $r_1$ and $r_2$, respectively, as depicted in FIG. 2B, light is confined more as the ratio $\delta = (r_2 - r_1)/r_1$ of the thickness $(r_2 - r_1)$ of the light emitting layer 3 with respect to the radius $r_1$ of the semiconductor nanowire 2 increases.

It is to be noted here that, while the radius of the semiconductor nanowire 2 is used in the calculation of δ in order to simplify the description, the factor to be used for the calculation is not limited to this. For example, where the sectional shape of the semiconductor nanowire 2 is a polygon (here, a hexagon) as depicted in FIG. 1B, the distance from the center to the sides of the semiconductor nanowire 2 may be used in place of the radius of the semiconductor nanowire 2. In other words, the sectional shape of the semiconductor nanowire 2 may be a circular shape or a polygon, and in any case, the distance from the center to the outer peripheral face may be used.

Further, light is confined more as the radius $r_1$ of the semiconductor nanowire 2 increases.

Further, light is confined more as the wavelength λ of light decreases, namely, as the wave number $k_0=2\pi/\lambda$ of light increases.

Therefore, in the present embodiment, the refractive indexes $n_1$ and $n_3$, radius $r_1$ of the semiconductor nanowire 2 and wave number $k_0$ are first set to certain values to determine a standardized frequency $V_0$ of the nanowire structure. Then, based on a graph indicating a variation of a standardized cutoff frequency V with respect to δ of each refractive index $n_2$ of the semiconductor material configuring the light emitting layer 3 in this case, a minimum value of δ with which the standardized cutoff frequency V coincides with the standardized frequency $V_0$, namely, with which light can be confined, is calculated. Then, taking the refractive index difference between the semiconductor material configuring the semiconductor nanowire 2 and the semiconductor material configuring the light emitting layer 3 into consideration, the condition of the mode I is defined using the product Δn·δ of Δn and δ and the product $r_1 \cdot k_0$ of $r_1$ and the wave number $k_0$ in order to generalize the foregoing.

Here, the standardized frequency $V_0$ can be represented as the following expression (1):

$$V_0 = k_0 r_1 \sqrt{n_1^2 - n_3^2} \qquad (1)$$

Further, a graph indicating a variation of the standardized cutoff frequency V with respect to δ of each refractive index of the semi conductor material configuring the light emitting layer 3 is obtained by performing numerical calculation using the following relational expression (2) of a cutoff condition:

$$\frac{J_1(U)}{UJ_0(U)} = \frac{J_1(V_1)Y_0(V_2) - Y_1(V_1)J_0(V_2)}{V_1[J_0(V_1)Y_0(V_2) - Y_0(V_1)J_0(V_2)]} \qquad (2)$$

Where $J_0$ and $J_1$ are Bessel functions of the first kind of the zeroth order and the first order, respectively, and $Y_0$ and $Y_1$ are Bessel functions of the second kind of the zeroth order and the first order, respectively. Further, $V_1$ and $V_2$ are calculated by the following expressions (3) and (4), respectively:

$$V_1 = \sqrt{V^2 \frac{n_2^2 - n_1^2}{n_1^2 - n_3^2} + U^2} \qquad (3)$$

$$V_2 = (\delta + 1)V_1 \qquad (4)$$

In this manner, the relational expressions of the cutoff condition are functions of U, δ and V. In this case, if a real number with which the relational expression of the cutoff condition is satisfied exists when U is varied from 0 to V at a certain value of δ, then this signifies that light is confined. Then, since a lower limit value of the real number with which the relational expression is satisfied becomes the standardized cutoff frequency V, by plotting the lower limit value, a graph indicating the variation of the standardized cutoff frequency V with respect to δ for each refractive index of the semiconductor material configuring the light emitting layer 3 can be obtained.

In particular, where $n_1=3.2$, $n_3=3.1$, $r_1=500$ nm and $\lambda=1.2$ μm ($k_0=0.00523$ nm$^{-1}$), the standardized frequency $V_0$ is 2.08 from the expression (1). This is indicated by a solid line X in FIG. 3. If the value of the standardized cutoff frequency V is at the upper side than the solid line X, then light is not confined.

Figure 3:
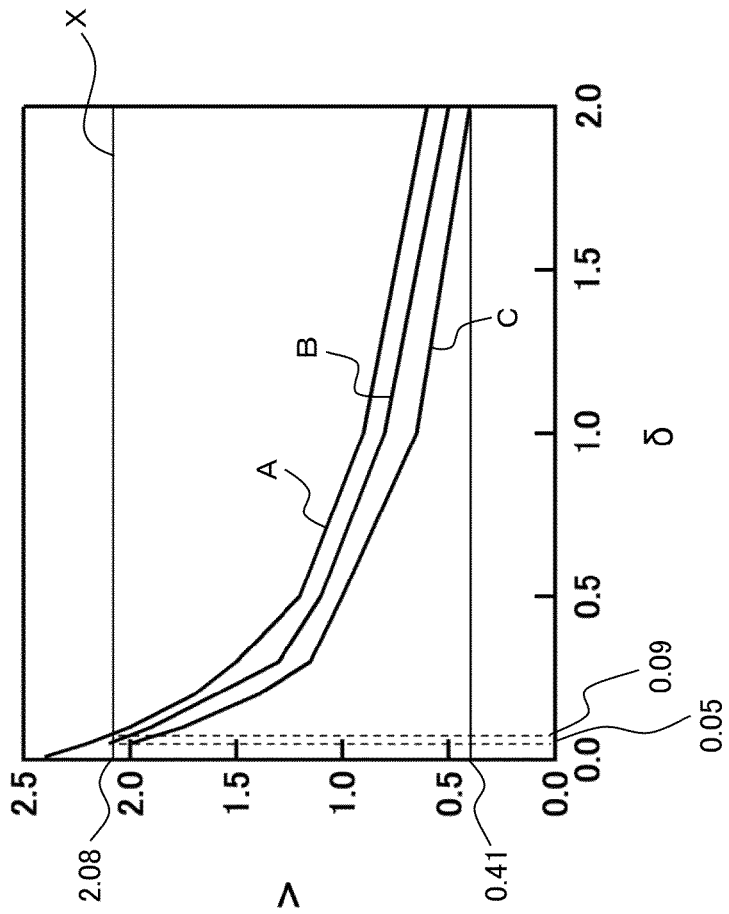
FIG. 3 is a view depicting a relationship between a ratio $\delta$ of the film thickness of the light emitting layer with respect to the radius of the semiconductor nanowire and a standardized cutoff frequency V and illustrating a condition of the mode I where $r_1=500$ nm and $\lambda=1.2$ μm.

Further, if $r_2$ is varied to vary the value of δ individually at $n_2=3.3$, 3.4 and 3.5, then a graph indicating the variation of the standardized cutoff frequency V with respect to δ in the case of each refractive index is indicated by solid lines A to C as depicted in FIG. 3, respectively. Here, in FIG. 3, the solid lines A, B and C indicate the variations in the cases of $n_2=3.3$, $n_2=3.4$ and $n_2=3.5$, respectively.

Therefore, if the value of the standardized cutoff frequency V with respect to δ indicated by each of the solid lines A to C in FIG. 3 is at the upper side than the solid line X, then light is not confined. For example, where $n_2=3.4$ as indicated by the solid line B, the minimum value of δ with which light is confined is 0.05. In other words, where $n_2=3.4$, if δ is equal to or higher than 0.05, then light is confined. Further, where $n_2=3.3$ as indicated by the solid line A, the minimum value of δ with which light is confined is 0.09. In other words, where $n_2=3.3$, if δ is equal to or higher than 0.09, then light is confined. In those cases, if the product Δn·δ of the values just mentioned and $\Delta n=(n_2-n_1)/n_1$ is calculated in order to generalize the foregoing taking the refractive index difference into consideration, then 0.003 and 0.002 are obtained as a result of the calculation. Thus, if Δn·δ is equal to or higher than 0.003 adopting the severer condition, then light is confined.

Further, the standardized frequency $V_0$ (=2.08) is calculated from the expression (1) given hereinabove and includes the radius $r_1$ of the semiconductor nanowire 2 and the wave number $k_0$. Then, light is confined more as the radius $r_1$ of the semiconductor nanowire 2 increases as described hereinabove. Further, light is confined more as the wavelength λ of light decreases, namely, as the wave number $k_0=2\pi/\lambda$ of light increases. Therefore, if the product $r_1 \cdot k_0$ of the factors described hereinabove is equal to or higher than 2.61 that is the product $r_1 \cdot k_0$ of the factors in the particular example, then light is confined.

Accordingly, if the condition is satisfied that Δn·δ is equal to or higher than 0.003 and $r_1 \cdot k_0$ is equal to or higher than 2.61, then light is confined in the semiconductor nanowire 2 and the light emitting layer 3. In other words, the condition that Δn·δ is equal to or higher than 0.003 and $r_1 \cdot k_0$ is equal to or higher than 2.61 is the condition of the mode I.

It is to be noted that it has been found that, where the condition of the mode I is satisfied, namely, where the optical confinement state described hereinabove is implemented, the radius of the semiconductor nanowire 2 has a lower limit. In particular, where δ is 2.0 in FIG. 3, while the thickness of the light emitting layer 3 is twice with respect to the radius of the semiconductor nanowire 2, this is a limit to the film thickness of the light emitting layer 3 with which the light emitting layer 3 can be formed on the side face of the semiconductor nanowire 2. Then, from the expression (1) given hereinabove, where the standardized cutoff frequency V is the lower limit value, the radius $r_1$ of the semiconductor nanowire 2 is the lower limit value. Therefore, in FIG. 3, the lower limit value to the standardized cutoff frequency V is 0.41 where δ is 2.0 at the refractive index $n_2$=3.5 indicated by the solid line C. Then, if the radius $r_1$ of the semiconductor nanowire 2 is calculated from the expression (1) given hereinabove using the value of 0.41 and $n_1$=3.2, $n_3$=3.1 and λ=1.2 μm ($k_0$=0.00523 $nm^{-1}$), then the radius $r_1$ is 100 nm.

Further, where the wavelength λ=1.4 μm (wave number $k_0$=0.00448 $nm^{-1}$) is used in place of λ=1.2 μm ($k_0$=0.00523 $nm^{-1}$) in the particular example described hereinabove, the standardized frequency $V_0$ is 1.78 from the expression (1) given hereinabove. This is indicated by a solid line X in FIG. 4. If the value of the standardized cutoff frequency V is at the upper side than the solid line X, then light is not confined.

Figure 4:
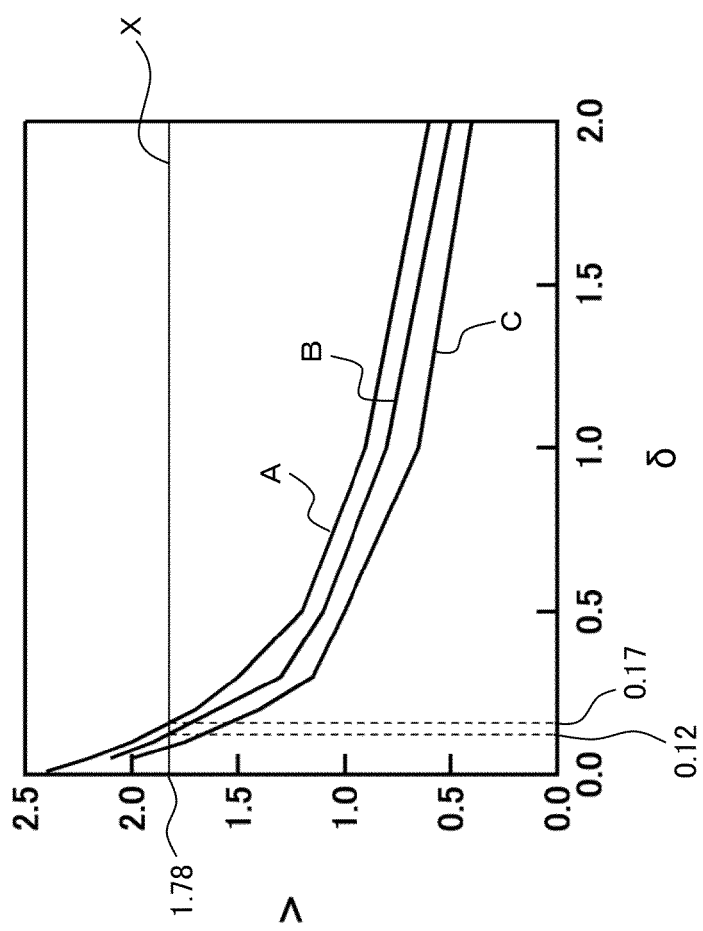
FIG. 4 is a view depicting a relationship between a ratio $\delta$ of the film thickness of the light emitting layer with respect to the radius of the semiconductor nanowire and the standardized cutoff frequency V and illustrating a condition of the mode I where $r_1=500$ nm and the wavelength $\lambda=1.4$ μm.

Further, if $r_2$ is varied to vary the value of δ individually at $n_2$=3.3, 3.4 and 3.5, then the graphs indicating the variations of the standardized cutoff frequency V with respect to δ in the case of each refractive index are indicated by solid lines A to C in FIG. 4, respectively. Here, the solid lines A, B and C indicate the variations in the cases of $n_2$=3.3, $n_2$=3.4 and $n_2$ 3.5, respectively.

Therefore, if the values of the standardized cutoff frequency V with respect to δ indicated by the solid lines A to C are at the upper side than the solid line X in FIG. 4, then light is not confined. For example, where $n_2$=3.4 as indicated by the solid line B, the minimum value of δ with which light is confined is 0.12. In other words, where $n_2$=3.4, if δ is equal to or higher than 0.12, then light is confined. Further, where $n_2$=3.3 as indicated by the solid line A, the minimum value of δ with which light is confined is 0.17. In other words, where $n_2$=3.3, if δ is equal to or higher than 0.17, then light is confined. In those cases, if the product Δn·δ of the values just mentioned and Δn=$(n_2-n_1)/n_1$ is calculated in order to generalize the foregoing taking the refractive index difference into consideration, then 0.007 and 0.005 are obtained as a result of the calculation. Therefore, if Δn·δ is equal to or higher than 0.007 adopting the severer condition, then light is confined.

Further, the standardized frequency $V_0$ (=1.78) used for determining the condition is calculated from the expression (1) given hereinabove and includes the radius $r_1$ of the semiconductor nanowire 2 and the wave number $k_0$. Then, light is confined more as the radius $r_1$ of the semiconductor nanowire 2 increases as described hereinabove. Further, light is confined more as the wavelength Δ of light decreases, namely, as the wave number $k_0$=2π/λ of light increases. Therefore, if the product $r_1 \cdot k_0$ of the factors mentioned above is equal to or higher than 2.24 that is the product $r_1 \cdot k_0$ of the factors in the present modification, then light is confined.

Accordingly, if the condition is satisfied that Δn·δ is equal to or higher than 0.007 and $r_1 \cdot k_0$ is equal to or higher than 2.24, then light is confined in the semiconductor nanowire 2 and the light emitting layer 3. In particular, the condition that Δn·δ is equal to or higher than 0.007 and $r_2 \cdot k_0$ is equal to or higher than 2.24 is the condition of the mode I.

Further, where $r_1$=200 nm is used in place of $r_1$=500 nm in the particular example described hereinabove, the standardized frequency $V_0$ at the wavelength 1.2 μm is 0.83 from the expression (1) given hereinabove. This is indicated by a solid line X in FIG. 5. If the value of the standardized cutoff frequency V is at the upper side than the solid line X, then light is not confined.

Figure 5:
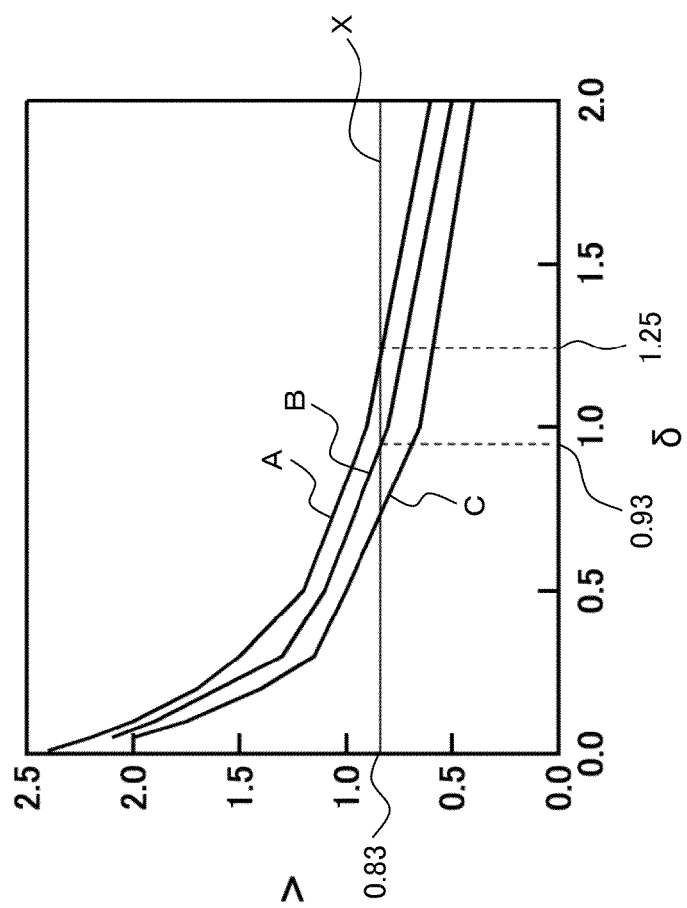
FIG. 5 is a view depicting a relationship between a ratio $\delta$ of the film thickness of the light emitting layer with respect to the radius of the semiconductor nanowire and the standardized cutoff frequency V, and illustrating a condition of the mode I where $r_1=200$ nm and $\lambda=1.2$ μm.

Further, if $r_2$ is varied to vary the value of δ individually at $n_3$=3.3, 3.4 and 3.5, then the graphs indicating the variations of the standardized cutoff frequency V with respect to δ in the case of each refractive index are indicated by solid lines A to C in FIG. 5, respectively. Here, in FIG. 5, the solid lines A, B and C indicate the variations in the cases of $n_2$=3.3, $n_2$=3.4 and $n_2$=3.5, respectively.

Therefore, if the values of the standardized cutoff frequency V with respect to δ indicated by the solid lines A to C in FIG. 5 are at the upper side than the solid line X, then light is not confined. For example, where $n_2$=3.4 as indicated by the solid line B, the minimum value of δ with which light is confined is 0.93. In particular, if δ is equal to or higher than 0.93 where $n_2$=3.4, then light is confined. Further, where $n_2$=3.3 as indicated by the solid line A, the minimum value of δ with which light is confined is 1.25. In other words, if δ is equal to or higher than 1.25 where $n_2$=3.3, then light is confined. In those cases, if the product Δn·δ of the values just described and the Δn=$(n_2-n_1)/n_1$ is calculated in order to generalize the foregoing taking the refractive index difference into consideration, then 0.058 and 0.039 are obtained as a result of the calculation. Therefore, if Δn·δ is equal to or higher than 0.058 adopting the severer condition, then light is confined.

Further, the standardized frequency $V_0$ (=0.83) used for determining the condition is calculated from the expression (1) given hereinabove and includes the radius $r_1$ of the semiconductor nanowire 2 and the wave number $k_0$. Then, light is confined more as the radius $r_1$ of the semiconductor nanowire 2 increases as described hereinabove. Further, light is confined more as the wavelength λ of light decreases, namely, as the wave number $k_0$=2π/Δ of light increases. Therefore, if the product $r_1 \cdot k_0$ of the factors described above is equal to or higher than 1.046 that is the product $r_1 \cdot k_0$ of the factors in the modification, then light is confined.

Accordingly, if the condition is satisfied that Δn·δ is equal to or higher than 0.058 and $r_1 \cdot k_0$ is equal to or higher than 1.046, then light is confined in the semiconductor nanowire 2 and the light emitting layer 3. In particular, the condition that Δn·δ is equal to or higher than 0.058 and $r_1 \cdot k_0$ is equal to or higher than 1.046 is the condition of the mode I.

Further, where $r_1$=200 nm is used in place of $r_1$=500 nm and the wavelength λ=1.4 μm (wave number $k_0$=0.00448 $nm^{-1}$) is used in place of λ=1.2 μm ($k_0$=0.00523 $nm^{-1}$) in the particular example described hereinabove, the standardized frequency $V_0$ is 0.71 from the expression (1) given hereinabove. This is indicated by the solid line X in FIG. 6. If the value of the standardized cutoff frequency V is at the upper side than the solid line X, then light is not confined.

Figure 6:
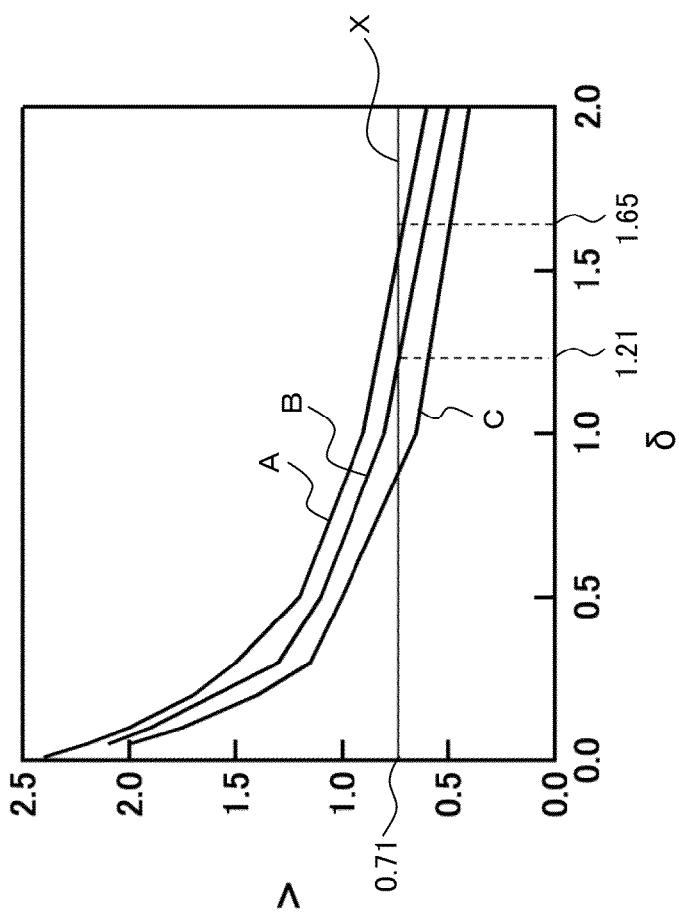
FIG. 6 is a view depicting a relationship between a ratio $\delta$ of the film thickness of the light emitting layer with respect to the radius of the semiconductor nanowire and the standardized cutoff frequency V and illustrating a condition of the mode I where $r_1=200$ nm and the wavelength $\lambda=1.4$ μm.

Further, if $r_2$ is varied to vary the value of δ individually at $n_2$=3.3, 3.4 and 3.5, then the graphs indicating the variations of the standardized cutoff frequency V with respect to δ in the case of each refractive index are indicated by solid lines A to C in FIG. 6, respectively. Here, in FIG. 6, the solid lines A, B and C indicate the variations in the cases of $n_2$=3.3, $n_2$=3.4 and $n_2$=3.5, respectively.

Therefore, if the values of the standardized cutoff frequency V with respect to δ indicated by the solid lines A to C are at the upper side than the solid line X in FIG. 6, then light is not confined. For example, where $n_2$=3.4, the minimum value of δ with which light is confined is 1.21 as indicated by the solid line B. In other words, if δ is equal to or higher than 1.21 where $n_2$=3.4, then light is confined. Further, where $n_2$=3.3, the minimum value of δ with which light is confined is 1.65 as indicated by the solid line A. In other words, if δ is equal to or higher than 1.65 where $n_2$=3.3, then light is confined. In those cases, the product Δn·δ of the values just mentioned and Δn=$(n_2-n_1)/n_1$ is calculated in order to generalize the foregoing taking the refractive index difference into consideration, then 0.075 and 0.051 are obtained as a result of the calculation. Therefore, if Δn·δ is equal to or higher than 0.075 adopting the severer condition, then light is confined.

Further, the standardized frequency $V_0$ (=0.71) used for determining the condition is calculated from the expression (1) given hereinabove and includes the radius $r_1$ of the semiconductor nanowire 2 and the wave number $k_0$. Then, light is confined more as the radius $r_1$ of the semiconductor nanowire 2 increases as described hereinabove. Further, light is confined more as the wavelength λ of light decreases, namely, as the wave number $k_0=2\pi/\lambda$ of light increases. Therefore, if the product $r_1 \cdot k_0$ of the factors described hereinabove is equal to or higher than 0.896 that is the product $r_1 \cdot k_0$ of the factors in the present modification, then light is confined.

Accordingly, if the condition is satisfied that Δn·δ is equal to or higher than 0.075 and $r_1 \cdot k_0$ is equal to or higher than 0.896, then light is confined in the semiconductor nanowire 2 and the light emitting layer 3. In other words, the condition that Δn·δ is equal to or higher than 0.075 and $r_1 \cdot k_0$ is equal to or higher than 0.896 is the condition of the mode I.

In short, if one of the condition that Δn·δ is equal to or higher than 0.003 and $r_1 \cdot k_0$ is equal to or higher than 2.61, the condition that Δn·δ is equal to or higher than 0.007 and $r_1 \cdot k_0$ is equal to or higher than 2.24, the condition that Δn·δ is equal to or higher than 0.058 and $r_1 \cdot k_0$ is equal to or higher than 1.046 and the condition that Δn·δ is equal to or higher than 0.075 and $r_1 \cdot k_0$ is equal to or higher than 0.896 is satisfied, then the optical confinement state in which the optical electric field is confined in the semiconductor nanowire 2 and the light emitting layer 3 is implemented. In other words, the semiconductor laser which can satisfy the condition of the mode I and has a more favorable light confinement structure can be implemented.

In the present embodiment, the semiconductor nanowire 2, light emitting layer 3 and cladding layer 5 are configured as a GaAs nanowire, an InGaAs light emitting layer and an AlGaAs cladding layer as described hereinabove, respectively. In this case, for example, if the radius of the GaAs nanowire 2, the In composition of the InGaAs light emitting layer 3 and the film thickness of the $In_{0.3}Ga_{0.7}As$ light emitting layer 3 are set to approximately 500 nm, 0.3 and approximately 50 nm, respectively, then, at the wavelength 1.2 μm, Δn·δ and the product Δn·δ are 0.032, 0.1 and 0.0032, respectively. Further, $r_1 \cdot k_0$ is 2.615. In other words, Δn·δ is equal to or higher than 0.003 and $r_1 \cdot k_0$ is equal to or higher than 2.61, and the condition of the mode I is satisfied. It is to be noted that, in this case, the film thickness of the AlGaAs cladding layer 5 may be set, for example, to approximately 150 nm.

Figure 7:
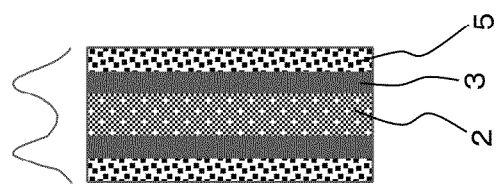
FIG. 7 is a schematic view depicting an optical electric field intensity distribution of an optical confinement state of a mode II in the semiconductor nanowire, light emitting layer and cladding layer configuring the semiconductor laser according to the present embodiment.

Incidentally, a condition for implementing an optical confinement state with which light is confined in the light emitting layer 3 has been found as indicated by an optical electric field intensity distribution of FIG. 7 in order to implement a semiconductor laser having a more favorable light confinement structure in the present semiconductor laser. Such an optical confinement state as just described is referred to as mode II and a condition for the optical confinement state is referred to as condition of the mode II.

A graph indicating the variation of the standardized cutoff frequency V with respect to δ for each refractive index of the semiconductor material configuring the light emitting layer 3 can be obtained by performing numerical calculation using the following expression (5) of a cutoff condition:

$$\frac{K_1(W)}{WK_0(W)} = \frac{\begin{array}{c}2[J_1(V_1)Y_1(V_2) - Y_1(V_1)J_1(V_2)] + \\ V_1[Y_0(V_1)J_1(V_2) - J_0(V_1)Y_1(V_2)]\end{array}}{\begin{array}{c}2V_2[Y_1(V_1)J_0(V_2) - J_1(V_1)Y_0(V_2)] + \\ V_1V_2[J_0(V_1)Y_0(V_2) - Y_0(V_1)J_0(V_2)]\end{array}} \quad (5)$$

where $K_0$ and $K_1$ are modified Bessel functions of the zeroth and first orders, respectively; $J_0$ and $J_1$ are Bessel functions of the first kind of the zeroth and first orders, respectively; and $Y_0$ and $Y_1$ are Bessel functions of the second kind of the zeroth and first orders, respectively. Further, $V_1$, $V_2$ and W are calculated by the following expressions (6), (7) and (8), respectively:

$$V_1 = \sqrt{V^2 \frac{n_2^2 - n_1^2}{n_1^2 - n_3^2} + U^2} \quad (6)$$

$$V_2 = (\delta + 1)V_1 \quad (7)$$

$$W = (\delta + 1)\sqrt{V^2 + U^2} \quad (8)$$

In this manner, the relational expressions of the cutoff condition are functions of U, δ and V. In this case, if a real number with which the relational expressions of the cutoff condition are satisfied exists when U is varied from 0 to V at a certain value of δ, then this signifies that light is confined. Then, since a lower limit value to the real number with which the relational expressions are satisfied is the standardized cutoff frequency V, by plotting the lower limit value, a graph indicating the variation of the standardized cutoff frequency V with respect to δ for each refractive index of the semiconductor material configuring the light emitting layer 3 can be obtained.

In particular, where $n_1$=3.2, $n_3$=3.1, $r_1$=500 nm and λ=1.2 μm ($k_0$=0.00523 $nm^{-1}$), the standardized frequency $V_0$ is 2.08 from the expression (1). This is indicated by a solid line X in FIG. 8. If the value of the standardized cutoff frequency V is at the upper side than the solid line X, then light is not confined.

Figure 8:
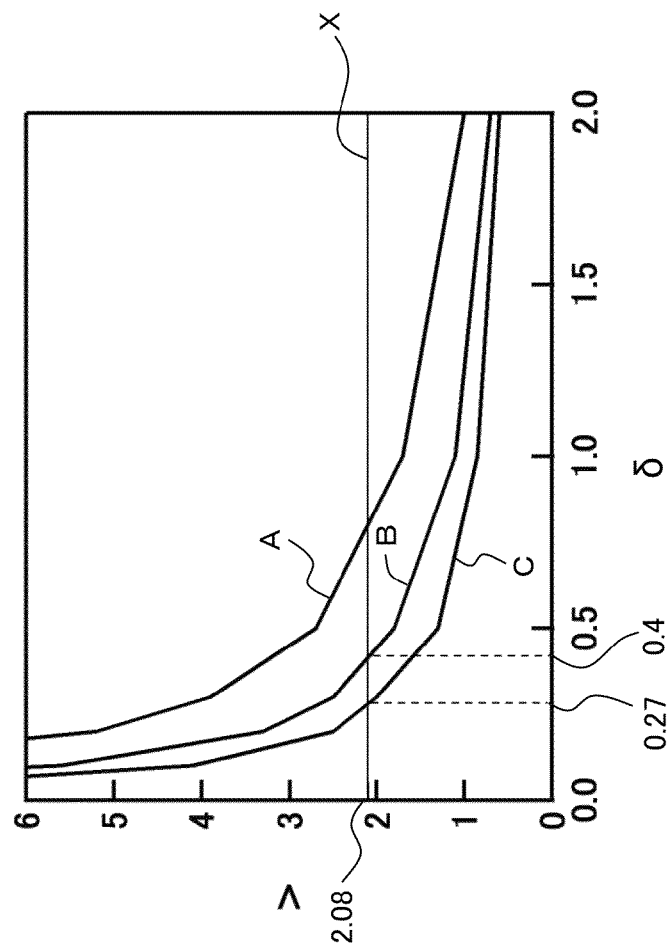
FIG. 8 is a view depicting a relationship between the ratio $\delta$ of the film thickness of the light emitting layer with respect to the radius of the semiconductor nanowire and the standardized cutoff frequency V, and illustrating a condition of the mode II where $r_1=500$ nm and $\lambda=1.2$ μm.

Further, if $r_2$ is varied to vary the value of δ individually at $n_2$=3.3, 3.4 and 3.5, then graphs indicating the variations of the standardized cutoff frequency V with respect to δ in the case of each refractive index are indicated by solid lines A to C as depicted in FIG. 8, respectively. Here, in FIG. 8, the solid lines A, B and C indicate the variations in the cases of $n_2$=3.3, $n_2$=3.4 and $n_2$=3.5, respectively.

Therefore, if the values of the standardized cutoff frequency V with respect to δ indicated by the solid lines A to C in FIG. 8 are at the upper side than the solid line X, then light is not confined. For example, where $n_2$=3.5 as indicated by the solid line C, the minimum value of δ with which light is confined is 0.27. In other words, where $n_2$=3.5, if δ is equal to or higher than 0.27, then light is confined. Further, where $n_2$=3.4 as indicated by the solid line B, the minimum value of δ with which light is confined is 0.4. In other words, where $n_3$=3.4, if δ is equal to or higher than 0.4, then light is confined. In those cases, if the product Δn·δ of the values just mentioned and Δn=$(n_2-n_1)/n_1$ is calculated in order to generalize the foregoing taking the refractive index difference into consideration, then 0.025 and 0.025 are obtained as a result of the calculation. Thus, if Δn·δ is equal to or higher than 0.025, then light is confined.

Further, the standardization frequency $V_0$ (=2.08) used for determining the condition is calculated from the expression (1) given hereinabove and includes the radius $r_1$ of the semiconductor nanowire 2 and the wave number $k_0$. Then, light is confined more as the radius $r_1$ of the semiconductor nanowire 2 increases as described above. Further, light is confined more as the wavelength $\lambda$ of light decreases, namely, as the wave number $k_0=2\pi/\lambda$ of light increases. Therefore, if the product $r_1 \cdot k_0$ of the factors mentioned above is equal to or higher than 2.61 that is the product $r_1 \cdot_0$ of the factors in the particular example, then light is confined.

Accordingly, if the condition is satisfied that $\Delta n \cdot \delta$ is equal to or higher than 0.025 and $r_1 \cdot k_0$ is equal to or higher than 2.61, then light is confined in the light emitting layer 3. In other words, the condition that $\Delta n \cdot \delta$ is equal to or higher than 0.025 and $r_1 \cdot k_0$ is equal to or higher than 2.61 is the condition of the mode II.

Further, where the wavelength $\lambda=1.4$ μm (wave number $k_0=0.00448$ nm$^{-1}$) is used in place of $\lambda=1.2$ μm ($k_0=0.00523$ nm$^{-1}$) in the particular example described above, the standardization frequency $V_0$ is 1.78 from the expression (1) given above. This is indicated by a solid line X in FIG. 9. If the value of the standardized cutoff frequency V is at the upper side than the solid line X, then light is not confined.

Figure 9:
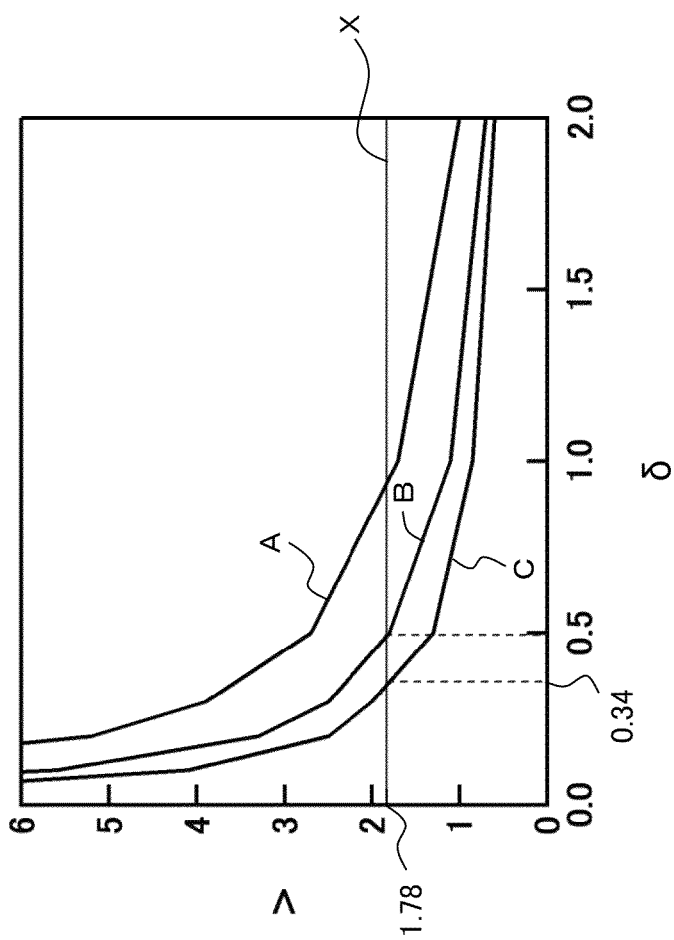
FIG. 9 is a view depicting a relationship between the ratio $\delta$ of the film thickness of the light emitting layer with respect to the radius of the semiconductor nanowire and the standardized cutoff frequency V, and illustrating a condition of the mode II where $r_1=500$ nm and the wavelength $\lambda=1.4$ μm.

Further, if $r_2$ is varied to vary the value of $\delta$ individually at the $n_2=3.3$, 3.4 and 3.5, then graphs indicating the variations of the standardized cutoff frequency V with respect to $\delta$ in the case of each refractive index are indicated by solid lines A to C in FIG. 9, respectively. Here, in FIG. 9, the solid lines A, B and C indicate the variations in the cases of $n_2=3.3$, $n_3=3.4$ and $n_2=3.5$, respectively.

Therefore, if the values of the standardized cutoff frequency v with respect to $\delta$ indicated by the solid lines A to C are at the upper side than the solid line X in FIG. 9, then light is not confined. For example, where $n_2=3.5$ as indicated by the solid line C, the minimum value of $\delta$ with which light is confined is 0.34. In other words, where $n_2=3.5$, if $\delta$ is equal to or higher than 0.34, then light is confined. Further, where $n_2=3.4$ as indicated by the solid line B, the minimum value of $\delta$ with which light is confined is 0.5. In other words, where $n_2=3.4$, if $\delta$ is equal to or higher than 0.5, then light is confined. In those cases, if the product $\Delta n \cdot \delta$ of the values just mentioned and $\Delta n=(n_2-n_1)/n_1$ is calculated in order to generalize the foregoing taking the refractive index difference into consideration, then 0.031 and 0.031 are obtained as a result of the calculation. Therefore, if $\Delta n \cdot \delta$ is equal to or higher than 0.031, then light is confined.

Further, the standardization frequency $V_0$ (=1.78) used for determining the condition is calculated from the expression (1) given hereinabove and includes the radius $r_1$ of the semiconductor nanowire 2 and the wave number $k_0$. Then, light is confined more as the radius $r_1$ of the semiconductor nanowire 2 increases as described above. Further, light is confined more as the wavelength $\lambda$ of light decreases, namely, as the wave number $k_0=2\pi/\lambda$ of light increases. Therefore, if the product $r_1 \cdot k_0$ of the factors mentioned above is equal to or higher than 2.24 that is the product $r_1 \cdot k_0$ of the factors in the present modification, then light is confined.

Accordingly, if the condition is satisfied that $\Delta n \cdot \delta$ is equal to or higher than 0.031 and $r_1 \cdot k_0$ is equal to or higher than 2.24, then light is confined in the light emitting layer 3. In other words, the condition that $\Delta n \cdot \delta$ is equal to or higher than 0.031 and $r_1 \cdot k_0$ is equal to or higher than 2.24 is the condition of the mode II.

Further, where $r_1=200$ nm is used in place of $r_1=500$ nm in the particular example described above, the standardization frequency $V_0$ in the case of the wavelength 1.2 μm is 0.83 from the expression (1) given above. This is indicated by a solid line X in FIG. 10. If the value of the standardized cutoff frequency V is at the upper side than the solid line X, then light is not confined.

Figure 10:
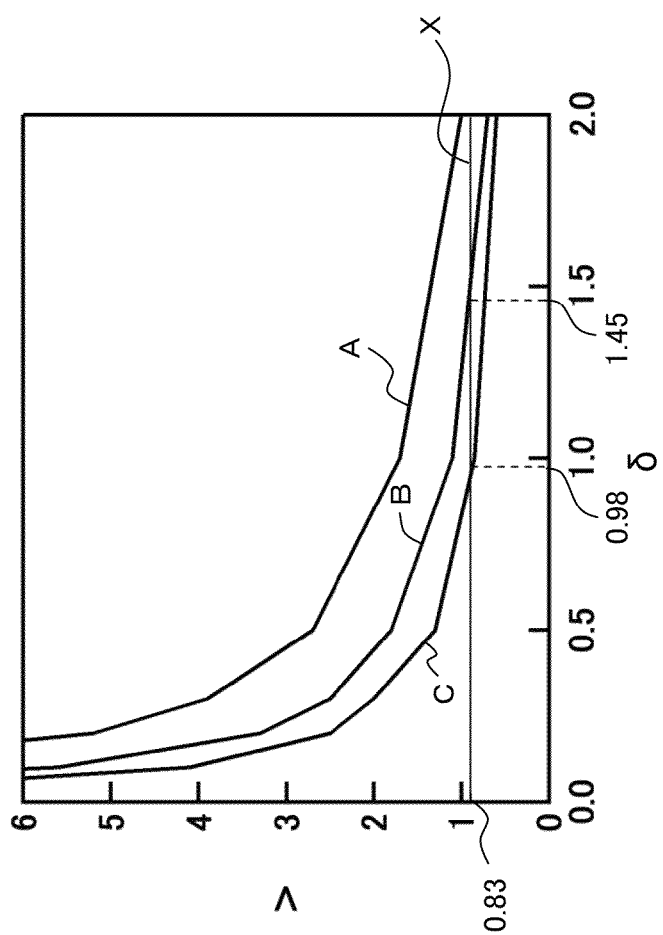
FIG. 10 is a view depicting a relationship between the ratio $\delta$ of the film thickness of the light emitting layer with respect to the radius of the semiconductor nanowire and the standardized cutoff frequency V, and illustrating a condition of the mode II where $r_1=200$ nm and $\lambda=1.2$ μm.

Further, if $r_2$ is varied to vary the value of $\delta$ individually at $n_2=3.3$, 3.4 and 3.5, then the graphs indicating the variations of the standardized cutoff frequency V with respect to $\delta$ in the case of each refractive index are indicated by solid lines A to C in FIG. 10, respectively. Here, in FIG. 10, the solid lines A, B and C indicate the variations in the cases of $n=3.3$, $n_2=3.4$ and $n_2=3.5$, respectively.

Therefore, if the values of the standardized cutoff frequency V with respect to $\delta$ indicated by the solid lines A to C are at the upper side than the solid line X in FIG. 10, then light is not confined. For example, where $n_2=3.5$ as indicated by the solid line C, the minimum value of $\delta$ with which light is confined is 0.98. In other words, where $n_2=3.5$, if $\delta$ is equal to or higher than 0.98, then light is confined. Further, where $n_2=3.4$ as indicated by the solid line B, the minimum value of $\delta$ with which light is confined is 1.45. In other words, where $n_2=3.4$, if $\delta$ is equal to or higher than 1.45, then light is confined. In those cases, if the product $\Delta n \cdot \delta$ of the values mentioned above and $\Delta n=(n_2-n_1)/n_1$ is calculated in order to generalize the foregoing taking the refractive index difference into consideration, then 0.091 and 0.090 are obtained as a result of the calculation. Therefore, if $\Delta n \cdot \delta$ is equal to or higher than 0.091 adopting the severer condition, then light is confined.

Further, the standardization frequency $V_0$ (=0.83) used for determining the condition is calculated from the expression (1) given hereinabove and includes the radius $r_1$ of the semiconductor nanowire 2 and the wave number $k_0$. Then, light is confined more as the radius $r_1$ of the semiconductor nanowire 2 increases as described above. Further, light is confined more as the wavelength $\lambda$ of light decreases, namely, as the wave number $k_0=2\pi/\lambda$ of light increases. Therefore, if the product $r_1 \cdot k_0$ of the factors mentioned above is equal to or higher than 1.046 that is the product $r_1 \cdot k_0$ of the factors in the present modification, then light is confined.

Accordingly, if the condition is satisfied that $\Delta n \cdot \delta$ is equal to or higher than 0.091 and $r_1 \cdot k_0$ is equal to or higher than 1.046, then light is confined in the light emitting layer 3. In other words, the condition that $\Delta n \cdot \delta$ is equal to or higher than 0.091 and $r_1 \cdot k_0$ is equal to or higher than 1.046 is the condition of the mode II.

Further, where $r_1=200$ nm is used in place of $r_1=500$ nm and the wavelength $\lambda=1.4$ μm (wave number $k_0=0.00448$ nm$^{-1}$) is used in place of $\lambda=1.2$ μm ($k_0=0.00523$ nm$^{-1}$) in the particular example described above, the standardization frequency $V_0$ in the case of the wavelength 1.4 μm is 0.71 from the expression (1) given hereinabove. This is indicated by a solid line X in FIG. 11. If the value of the standardized cutoff frequency V is at the upper side than the solid line X, then light is not confined.

Figure 11:
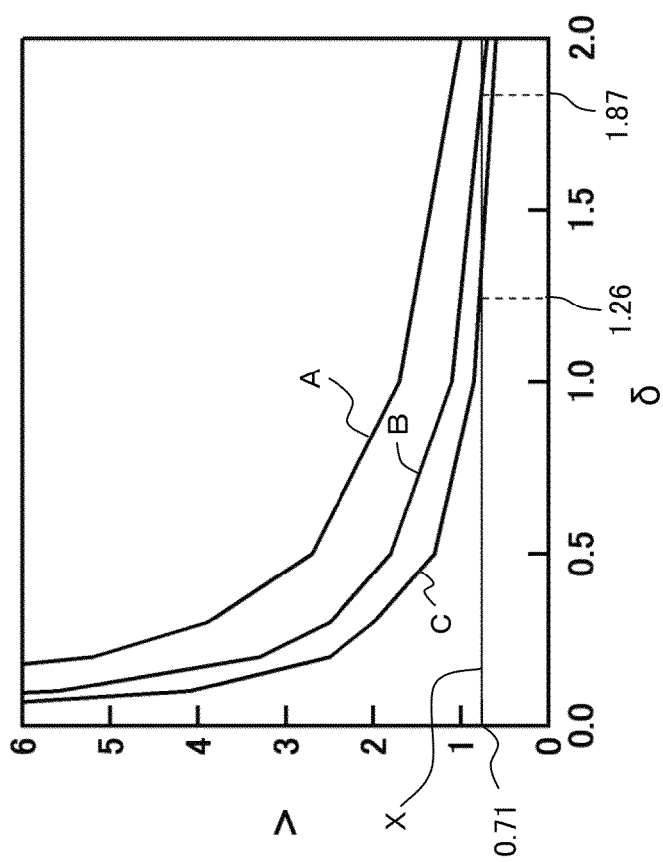
FIG. 11 is a view depicting a relationship between the ratio $\delta$ of the film thickness of the light emitting layer with respect to the radius of the semiconductor nanowire and the standardized cutoff frequency V, and illustrating a condition of the mode II where $r_1=200$ nm and the wavelength $\lambda=1.4$ μm.

Further, if $r_2$ is varied to vary the value of $\delta$ individually at $n_2=3.3$, 3.4 and 3.5, then graphs indicating the variations of the standardized cutoff frequency V with respect to $\delta$ in the case of each refractive index are indicated by solid lines A to C in FIG. 11, respectively. Here, in FIG. 11, the solid lines A, B and C indicate the variations in the cases of $n_2=3.3$, $n_2=3.4$ and $n_2=3.5$, respectively.

Therefore, if the values of the standardized cutoff frequency V with respect to $\delta$ indicated by the solid lines A to C are at the upper side than the solid line X in FIG. 11, then light is not confined. For example, where $n_2=3.5$ as indicated by the solid line C, the minimum value of $\delta$ with which light is confined is 1.26. In other words, where $n_2=3.5$, if $\delta$ is equal to or higher than 1.26, then light is confined. Further, where $n_2=3.4$ as indicated by the solid line B, the minimum value of $\delta$ with which light is confined is 1.87. In other words, where $n_2=3.4$, if $\delta$ is equal to or higher than 1.87, then light is confined. In those cases, if the product $\Delta n \cdot \delta$ of the values mentioned above and $\Delta n=(n_2-n_1)/n_1$ is calculated in order to generalize the foregoing taking the refractive index difference into consideration, then 0.118 and 0.116 are obtained as a result of the calculation. Therefore, if $\Delta n \cdot \delta$ is equal to or higher than 0.118 adopting the severer condition, then light is confined.

Further, the standardization frequency $V_0$ (=0.71) used for determining the condition is calculated from the expression (1) given hereinabove and includes the radius $r_1$ of the semiconductor nanowire 2 and the wave number $k_0$. Then, light is confined more as the radius $r_1$ of the semiconductor nanowire 2 increases as described above. Further, light is confined more as the wavelength $\lambda$ of light decreases, namely, as the wave number $k_0=2\pi/\lambda$ of light increases. Therefore, if the product $r_1 \cdot k_0$ of the factors mentioned above is equal to or higher than 0.896 that is the product $r_1 \cdot k_0$ of the factors in the present modification, then light is confined.

Accordingly, if the condition is satisfied that $\Delta n \cdot \delta$ is equal to or higher than 0.118 and $r_1 \cdot k_0$ is equal to or higher than 0.896, then light is confined in the light emitting layer 3. In other words, the condition that $\Delta n \cdot \delta$ is equal to or higher than 0.118 and $r_2 \cdot k_0$ is equal to or higher than 0.896 is the condition of the mode II.

After all, if one of the condition that $\Delta n \cdot \delta$ is equal to or higher than 0.025 and besides $r_1 \cdot k_0$ is equal to or higher than 2.61, the condition that $\Delta n \cdot \delta$ is equal to or higher than 0.031 and besides $r_1 \cdot k_0$ is equal to or higher than 2.24, the condition that $\Delta n \cdot \delta$ is equal to or higher than 0.091 and besides $r_1 \cdot k_0$ is equal to or higher than 1.046 and the condition that $\Delta n \cdot \delta$ is equal to or higher than 0.118 and besides $r_1 \cdot k_0$ is equal to or higher than 0.896 is satisfied, then an optical confinement state in which an electric field of light is confined in the light emitting layer 3 is established. In other words, it is possible to implement a semiconductor laser that satisfies the condition of the mode II and has a more favorable light confinement structure. Especially, since an electric field of light is confined strongly in the light emitting layer 3 and has a strong overlap with the light emitting layer 3, oscillation with a lower threshold value can be achieved.

In order to satisfy the condition of the mode II when an AlGaInAs-based material is used as in the present embodiment, the following is preferable. In particular, it is preferable to form the semiconductor nanowire 2 from an AlGaAs nanowire, form the light emitting layer 3 from an InGaAs light emitting layer and form the cladding layer 5 from an AlGaAs cladding layer because the film thickness of the InGaAs light emitting layer 3 can be reduced to obtain a high value of $\Delta n \cdot \delta$. In this instance, for example, if the radius of the AlGaAs nanowire 2 is set to approximately 500 nm and the Al composition of the AlGaAs nanowire 2 is set to 0.3 while the In composition of the InGaAs light emitting layer 3 is set to 0.3 and the film thickness of the InGaAs light emitting layer 3 is set to approximately 150 nm, then $\Delta n$ is 0.085 and $\delta$ is 0.3 at the wavelength of 1.2 μm, and the product $\Delta n \cdot \delta$ of them is 0.0255. Further, $r_1 \cdot k_0$ is 2.61. In other words, $\Delta n \cdot \delta$ is equal to or higher than 0.025 and besides $r_1 \cdot k_0$ is equal to or higher than 2.61, and consequently, the condition of the mode II is satisfied. It is to be noted that, in this case, for the AlGaAs cladding layer 5, the Al composition may be set to 0.4, and the film thickness may be set, for example, to approximately 250 nm.

Now, a fabrication method for the semiconductor laser according to the present embodiment is described with reference to FIGS. 12A to 12H.

First, a metal particulate (catalytic metal) 10 and a $SiO_2$ film 4A as the insulating film 4, namely, a $SiO_2$ insulating film ($SiO_2$ mask), are provided on an n-type GaAs substrate 1 as depicted in FIG. 12A. In particular, a $SiO_2$ insulating film 4A having an opening in a region in which a semiconductor nanowire 2 is to be grown is formed on an n-type GaAs substrate 1, and a metal particulate 10 is provided in the opening. A semiconductor nanowire growing substrate is fabricated in this manner. Here, the impurity concentration of the n-type GaAs substrate 1 may be, for example, approximately $5 \times 10^{17}$ to $1 \times 10^{19}$ cm$^{-3}$. It is to be noted that the opening may have a size corresponding to the diameter of the semiconductor nanowire 2.

Then, an n-type GaAs nanowire as the semiconductor nanowire 2 is grown on the n-type GaAs substrate 1 in such a manner as to extend in a direction perpendicular to the front face of the n-type GaAs substrate 1, for example, by a metal organic vapor phase epitaxy (MOVPE) method. In this case, the $SiO_2$ insulating film 4A (4) contacts with part of a side face of the n-type GaAs semiconductor nanowire 2. Here, as the raw material of GaAs, for example, triethylgallium (TEG) or arsine ($AsH_4$) may be used. Meanwhile, as the n-type dopant, for example, Si may be used, and as the raw material therefor, for example, disilane ($Si_2H_4$) may be used. Further, the impurity concentration may be, for example, approximately $5 \times 10^{17}$ to approximately $1 \times 10^{19}$ cm$^{-3}$.

After the n-type GaAs nanowire 2 is formed in this manner, the metal particulate 10 is removed as depicted in FIG. 12C, and an InGaAs layer as the light emitting layer 3, namely, an InGaAs light emitting layer, is formed on the $SiO_2$ insulating film 4A (4) in such a manner as to cover the side face (periphery) of the n-type GaAs nanowire 2, for example, by an MOVPE method. In this case, a lower end portion of the InGaAs light emitting layer 3 contacts with the front face of the $SiO_2$ insulating film 4A (4).

Then, a p-type AlGaAs layer as the cladding layer 5, namely, a p-type AlGaAs cladding layer, is formed on the $SiO_2$ insulating film 4A (4) in such a manner as to cover a side face (periphery) of the InGaAs light emitting layer 3, for example, by an MOVPE method. In this case, a lower end portion of the p-type AlGaAs cladding layer 5 contacts with the front face of the $SiO_2$ insulating film 4A (4). Here, as the p-type dopant, for example, Zn may be used, and as the raw material therefor, for example, diethyl zinc (DEZ) may be used. Meanwhile, the impurity concentration may be, for example, approximately $5 \times 10^{17}$ to approximately $1 \times 10^{19}$ cm$^{-3}$. Further, as the raw material for GaAs, for example, triethylgallium (TEG) or arsine ($AsH_4$) may be used. Meanwhile, as the Al raw material, for example, trimethyl aluminum (TMAl) may be used. Especially, in order to obtain a good conductivity, the Al composition of the p-type AlGaAs cladding layer 5 is preferably set to approximately 0.1 to approximately 0.4. However, the Al composition of the p-type AlGaAs cladding layer 5 is not limited to this.

It is to be noted that, in order to couple, after the p-type AlGaAs cladding layer 5 is formed in this manner, the cladding layer 5 to the p-side electrode 6 in low resistance, a contact layer not depicted may be formed in such a manner as to cover a side face (periphery) of the p-type AlGaAs cladding layer 5. For example, a p-type GaAs contact layer of a thickness of approximately 1 nm to approximately 10 nm may be formed.

Then, after a $SiO_2$ film 4B as the insulating film 4, namely, a $SiO_2$ insulating film, is formed on the front surface as depicted in FIG. 12D, the resist 11 is patterned as depicted in FIG. 12E, and part of the SiO$_2$ film 4B, namely, a portion of the SiO$_2$ film 4B which covers the side face of the cladding layer 5, is removed by etching as depicted in FIG. 12F. The side face of the p-type AlGaAs cladding layer 5 is exposed in this manner.

Then, after the resist 11 is removed, a metal film as the p-side electrode 6, namely, a p-side metal electrode, is formed in such a manner as to cover a side face of the p-type AlGaAs cladding layer 5 and the front face of the SiO$_2$ insulating film 4B (4) as depicted in FIG. 12G.

Thereafter, after the back face of the substrate 1 is worked, metal films that serve as both of the lower reflection film 9 and the n-side electrode 7, namely, a metal film reflection film and an n-type metal electrode, are formed in such a manner as to cover the back face of the substrate 1 as depicted in FIG. 12H. Further, a dielectric multilayer film as the upper reflection mirror 8, namely, a dielectric multilayer reflection film, is formed at upper end portions of the n-type GaAs semiconductor nanowire 2, InGaAs light emitting layer 3 and p-type AlGaAs cladding layer 5.

The semiconductor layer according to the present embodiment can be fabricated in this manner.

Accordingly, with the semiconductor layer according to the present embodiment, there is an advantage that a very small semiconductor laser having a good light emitting characteristic can be implemented.

In particular, in a very small semiconductor layer that is suitable for downscaling and high integration of an apparatus and has a small in-plane size and that uses a semiconductor nanowire of a diameter, for example, equal to or smaller than approximately 10 μm. Especially, in a semiconductor laser that is good in matching property with a Si-based passive device and emits laser light of a long wavelength equal to or greater than 1.2 μm, a good light emitting characteristic can be implemented.

It is to be noted that the present invention is not limited to the configuration described in the foregoing description of the embodiment but can be modified in various forms without departing from the subject matter of the present invention.

For example, in the embodiment described above, the case in which the materials configuring the substrate 1, semiconductor nanowire 2, light emitting layer 3 and cladding layer 5 include GaAs, GaAs, InGaAs and AlGaAs, respectively, and AlGaInAs-based materials are used is taken as an example. However, the present invention is not limited to this. For example, InGaAsP-based materials may be used and the materials configuring the substrate 1, semiconductor nanowire 2, light emitting layer 3 and cladding layer 5 may include InP, InP, InGaAsP or InGaAs and InGaP, respectively.

In this case, for example, if the radius of the InP nanowire 2 is set to approximately 200 nm and the InGaAsP light emitting layer 3 is formed as an In$_{0.85}$Ga$_{0.15}$As$_{0.33}$P$_{0.67}$ light emitting layer and besides the film thickness of this layer is set to approximately 250 nm, then at the wavelength of 1.2 μm, Δn becomes 0.0479 and δ becomes 1.25. Consequently, the product Δn·δ of them becomes 0.0598. Further, r$_1$·k$_0$ becomes 1.046. In other words, Δn·δ becomes equal to or higher than 0.058 and besides r$_1$·k$_0$ becomes equal to or higher than 1.046, and the condition of the mode I is satisfied. It is to be noted that, in this case, the film thickness of the InGaP cladding layer 5 may be set, for example, to approximately 100 nm.

Meanwhile, if the radius of the InP nanowire 2 is set to approximately 500 nm and the InGaAsP light emitting layer 3 is formed as an In$_{0.85}$Ga$_{0.15}$As$_{0.33}$P$_{0.67}$ light emitting layer and besides the film thickness of this layer is set to approximately 250 nm, then at the wavelength of 1.2 μm, Δn becomes 0.0479 and δ becomes 0.5. Consequently, the product Δn·δ of them becomes 0.0284. Further, r$_1$·k$_0$ becomes 2.615. In other words, Δn·δ becomes equal to or higher than 0.025 and besides and r$_1$·k$_0$ becomes equal to or higher than 2.61, and the condition of the mode II is satisfied. It is to be noted that, in this case, the film thickness of the InGaP cladding layer 5 may be set, for example, to approximately 200 nm.

Figure 13:
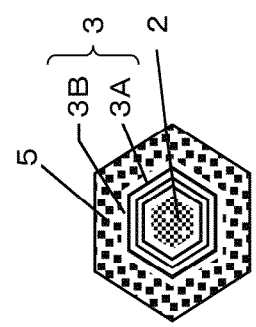
FIG. 13 is a schematic sectional view depicting a configuration of a semiconductor laser according to a first modification to the present embodiment.
Figure 14:
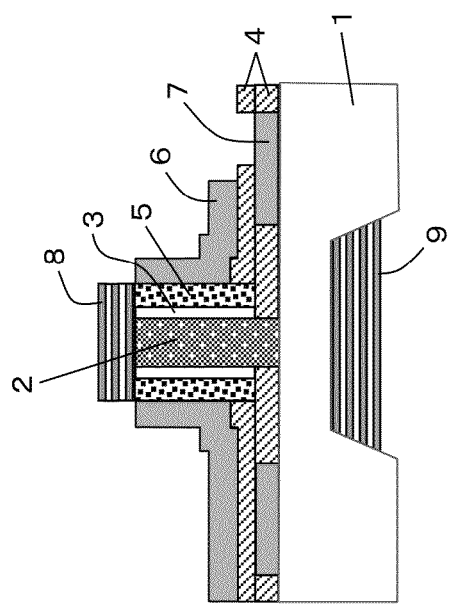
FIG. 14 is a schematic sectional view depicting a configuration of a semiconductor laser according to a second modification to the present embodiment.

Further, while the light emitting layer 3 in the embodiment described hereinabove is formed as a bulk InGaAs layer, the light emitting layer 3 is not limited to this, but it may be formed, for example, as a quantum well light emitting layer having a quantum well structure as depicted in FIG. 13. This is referred to as first modification.

In this case, for example, the semiconductor nanowire 2 may be formed as an AlGaAs nanowire, and the light emitting layer 3 may be formed as a GaAs/InGaAs quantum well light emitting layer configured from a GaAs layer 3A and an InGaAs layer 3B stacked with each other while the cladding layer 5 is formed as an AlGaAs cladding layer. Here, the GaAs/InGaAs quantum well light emitting layer 3 is configured by providing, in the inside of the InGaAs layer 3B (barrier layer; second semiconductor layer), the GaAs layer 3A (well layer; fourth semiconductor layer) having a band gap smaller than that of the InGaAs layer 3B. In this case, the light emitting layer 3 includes InGaAs. Further, for example, if the Al composition of the AlGaAs nanowire 2 is set, for example, to 0.3 and the radius of the Al$_{0.3}$Ga$_{0.7}$As nanowire 2 is set to approximately 200 nm and besides the film thickness of the GaAs/InGaAs quantum well light emitting layer 3 in which five InGaAs layers 3B are provided is set to approximately 230 nm (the total thickness of the GaAs layers 3A is approximately 210 nm and the total film thickness of the InGaAs layers 3B is 20 nm), then at the wavelength of 1.2 μm, Δn becomes 0.057 and δ becomes 1.15. Consequently, the product Δn·δ of them becomes 0.0655, and r$_1$·k$_0$ becomes 1.046. In other words, Δn·δ is equal to or higher than 0.058 and r$_1$·k$_0$ is equal to or higher than 1.046, and the condition of the mode I is satisfied. It is to be noted that, in this case, as regards the InGaAs layer 3B configuring the GaAs/InGaAs quantum well light emitting layer 3, the In composition is set to 0.6 and the film thickness is set to approximately 4 nm. Further, as the refractive index of the GaAs/InGaAs quantum well light emitting layer 3, an average value weighted by the film thickness is used. Further, the Al composition of the AlGaAs cladding layer 5 may be set, for example, to approximately 0.4 and the film thickness of the same may be set, for example, to approximately 100 nm.

Further, for example, the semiconductor nanowire 2 may be formed as an InP nanowire, and the light emitting layer 3 may be formed as an InGaAs/InGaAsP quantum well light emitting layer configured from an InGaAs layer 3A and an InGaAsP layer 3B stacked with each other while the cladding layer 5 is formed as an InGaP cladding layer. Here, the InGaAs/InGaAsP quantum well light emitting layer 3 is configured by providing, in the inside of the InGaAsP layer 3B (barrier layer; second semiconductor layer), the InGaAs layer 3A (well layer; fourth semiconductor layer) having a band gap smaller than that of the InGaAsP layer 3B. Further, for example, if the radius of the InP nanowire 2 is set to approximately 500 nm and the InGaAs/InGaAsP quantum well light emitting layer 3 is formed as an InGaAs/In$_{0.85}$Ga$_{0.15}$As$_{0.33}$P$_{0.67}$ quantum well light emitting layer in which five InGaAs layers 3B are provided and the film thickness of the same is set to approximately 250 nm (the total thickness of the InGaAsP layers 3B is approximately 240 nm and the total film thickness of the InGaAs layers 3A is 15 nm), then at the wavelength of 1.2 μm, Δn is 0.0518 and δ is 0.51. Consequently, the product Δn·δ of them is 0.0264, and $r_1 \cdot k_0$ is 2.615. In other words, Δn·δ is equal to or higher than 0.025 and besides $r_1 \cdot k_0$ is equal to or higher than 2.61, and the condition of the mode II is satisfied. It is to be noted that, in this case, the In composition of the InGaAs layer 3A configuring the InGaAs/In$_{0.85}$Ga$_{0.15}$As$_{0.33}$P$_{0.67}$ quantum well light emitting layer 3 is set to 0.56 and the film thickness is set to approximately 3 nm. It is to be noted here that, as the refractive index of the InGaAs/InGaAsP quantum well light emitting layer 3, an average value weighted with the film thickness is used. Further, the film thickness of the InGaP cladding layer 5 may be set, for example, to approximately 200 nm.

Further, while the above-described embodiment is described taking the case in which the metal layers formed on the back face of the substrate serve as both of the lower reflection film 9 and the n-side electrode 7 as an example, the metal film is not limited to this. In other words, the position and the shape of the lower reflection mirror 9 and the position of the n-side electrode 7 are not limited to those of the embodiment described hereinabove.

For example, where the condition of the mode I described above is satisfied, the upper reflection mirror B may be provided at least over an upper end portion of the semiconductor nanowire 2 and an upper end portion of the light emitting layer 3 and the lower reflection mirror 9 may be provided at least under a lower end portion of the semiconductor nanowire 2 and a lower end portion of the light emitting layer 3. On the other hand, where the condition of the mode II described hereinabove is satisfied, the upper reflection mirror 8 may be provided at least over an upper end portion of the light emitting layer 3 and the lower reflection mirror 9 may be provided at least under a lower end portion of the light emitting layer 3. Further, the lower reflection mirror 9 may be a multilayer film reflection mirror provided at the substrate side of the semiconductor nanowire 2.

In particular, the n-side electrode 7 may be provided not on the back face of the substrate 1 but on the front face of the substrate 1, and the lower reflection mirror 9 may be formed as a multilayer film reflection mirror provided on the back face of the substrate 1. This is referred to as second modification.

Here, the multilayer film reflection mirror 9 may be formed as a dielectric multilayer film reflection mirror. In this case, the semiconductor laser structured such that both of the p-side electrode 6 and the n-side electrode 7 are provided at the front face side of the substrate and have a current injection structure in which current is injected from the substrate front face side through the electrodes 6 and 7 and besides dielectric multilayer film reflection mirrors 8 and 9 with which a high reflectance is obtained with a small number of cycles are provided over and under the semiconductor nanowire 2 and the light emitting layer 3. Further, one electrode (n-side electrode 7) is electrically coupled to an end portion of the semiconductor nanowire 2 through the semiconductor substrate 1.

Figure 15:
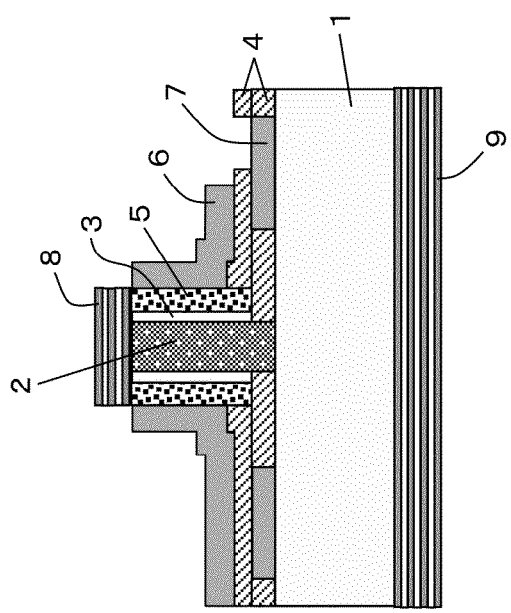
FIG. 15 is a schematic sectional view depicting a configuration of a semiconductor laser according to a third modification to the present embodiment.

Further, while, in the present second modification, the dielectric multilayer film reflection film 9 is provided in a recessed portion formed by working the back face of the substrate 1, the reflection mirror is not limited to this. For example, a multilayer film reflection mirror as the lower reflection mirror 9 may be provided without working the back face of the substrate 1 as depicted in FIG. 15. This is referred to as third modification. It is to be noted that, also in the embodiment described hereinabove, metal films that function as the lower reflection mirror 9 and the n-side electrode 7 may be provided without working the back face of the substrate 1 similarly. However, it is preferable to form a recessed portion by working the back face of the substrate 1 in that the spread of light in the substrate 1 can be suppressed. It is to be noted that, since, in the configurations of the modifications, the lower reflection mirror 9 is provided under lower end portions of the semiconductor nanowire 2, light emitting layer 3 and cladding layer 5, the configuration described above can be applied in both of a case in which the condition of the mode I is satisfied and another case in which the condition of the mode II is satisfied.

Figure 16:
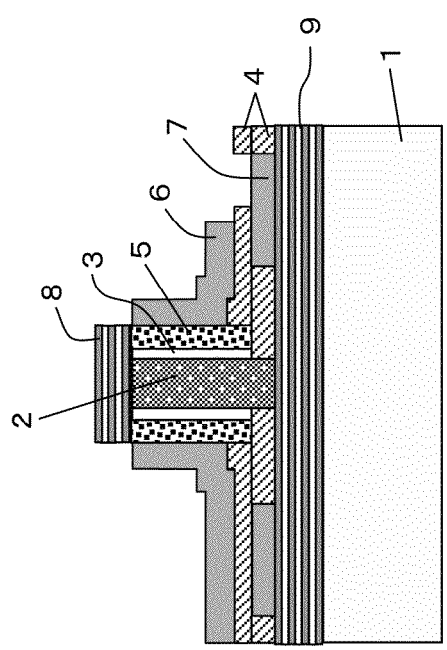
FIG. 16 is a schematic sectional view depicting a configuration of a semiconductor laser according to a fourth modification to the present embodiment.

Further, for example, the lower reflection mirror 9 may be formed as a multilayer film reflection mirror provided on the front face of the substrate 1 in place of the provision on the back face of the substrate 1 as depicted in FIG. 16. This is referred to as fourth modification.

Here, the multilayer film reflection mirror 9 may be formed as a conductive multilayer film reflection mirror provided at least between the substrate 1 and the semiconductor nanowire 2 and light emitting layer 3. For example, the material configuring the multilayer film reflection mirror 9 may be a conductive semiconductor material. Further, the lower end portion of the semiconductor nanowire 2 may contact with the front face of the conductive multilayer film reflection mirror 9. Further, the insulating film 4 may be provided on the front face of the conductive multilayer film reflection mirror 9 such that it contacts with part of a side face of the semiconductor nanowire 2 and besides a lower end portion of the light emitting layer 3 contacts with part of the front face of the insulating film 4. Further, the n-side electrode 7 may be provided on the front face of the conductive multilayer film reflection mirror 9. In this case, the semiconductor nanowire 2 is provided over the substrate 1. Further, both of the p-side electrode 6 and the n-side electrode 7 are provided on the front face side of the substrate and a current injection structure in which current is injected from the substrate front face side through the electrodes is provided, and besides the multilayer film reflection mirrors 8 and 9 with which a high reflectance is obtained with a small number of cycles are provided over and under the semiconductor nanowire 2 and the light emitting layer 3 at the substrate front face side and have a structure in which the spread of light in the substrate 1 can be suppressed. Further, one (n-side electrode 7) of the electrodes is electrically coupled to an end portion of the semiconductor nanowire 2 through the conductive multilayer film reflection mirror 9 and the semiconductor substrate 1. Further, the lower reflection film 9 is provided at a lower end portion side of the semiconductor nanowire 2.

Figure 17:
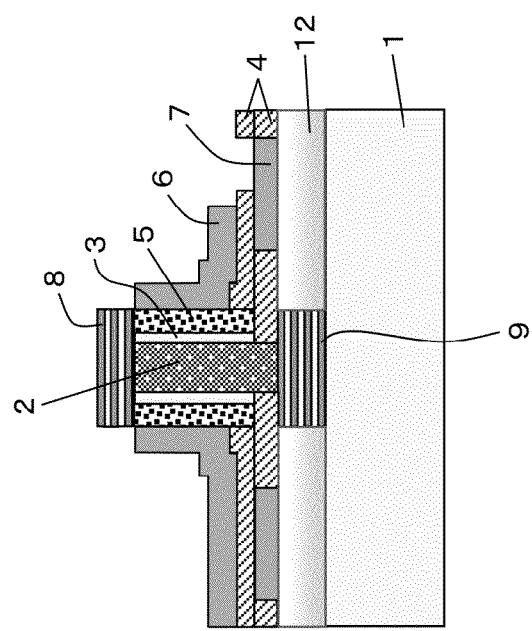
FIG. 17 is a schematic sectional view depicting a configuration of a semiconductor laser according to a fifth modification to the present embodiment.

Further, while, in the present fourth modification, the conductive multilayer film reflection mirror 9 is provided on the overall front face of the substrate 1, the provision of the conductive multilayer film reflection mirror 9 is not limited to this. For example, as depicted in FIG. 17, the conductive multilayer film reflection mirror 9 may be provided partially on the front face of the substrate 1 while a conductive semiconductor layer 12 is provided in such a manner as to be coupled to the conductive multilayer film reflection mirror 9 and the n-side electrode 7 is provided on the front face of the conductive semiconductor layer 12. This is referred to as fifth modification. As the conductive semiconductor layer 12, preferably a low resistance semiconductor layer of a high impurity concentration is used. Here, the conductive multilayer film reflection mirror 9 may be provided at least between the substrate 1 and the semiconductor nanowire 2 and light emitting layer 3. Here, the conductive multilayer film reflection mirror 9 is provided between the semiconductor nanowire 2 and the light emitting layer 3 and cladding layer 5. In this manner, in a region on the front face of the substrate 1 other than the region in which the conductive multilayer film reflection mirror 9 is provided, the conductive semiconductor layer 12 may be provided in place of the conductive multilayer film reflection mirror 9. In other words, a portion of the conductive multilayer film reflection mirror 9 at which the conductive multilayer film reflection mirror 9 contacts with the n-side electrode 7 may be replaced by the conductive semiconductor layer 12. This makes it possible to implement a more favorable current injection structure. In this case, one (n-side electrode 7) of the electrodes is electrically coupled to an end portion of the semiconductor nanowire 2 through the conductive semiconductor layer 12, conductive multilayer film reflection mirror 9 and semiconductor substrate 1.

It is to be noted that, while, in the configurations of the fourth and fifth modifications, the lower reflection film 9 is provided under lower end portions of the semiconductor nanowire 2, light emitting layer 3 and cladding layer 5, both configurations can be applied in both of a case in which the condition of the mode I is satisfied and in another case in which the condition of the mode II is satisfied.

Figure 18:
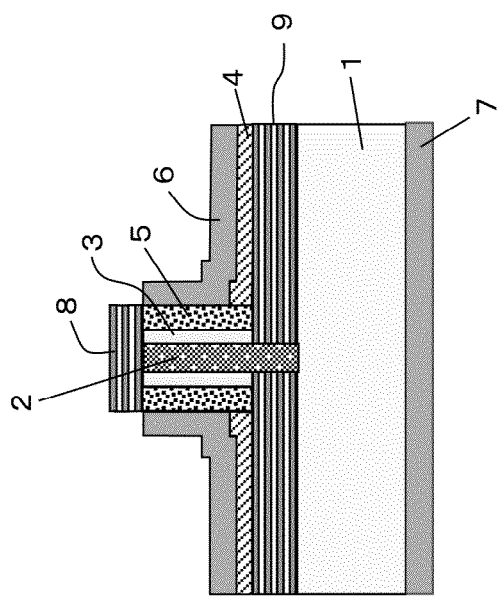
FIG. 18 is a schematic sectional view depicting a configuration of a semiconductor laser according to a sixth modification to the present embodiment.

Further, for example, the lower reflection film 9 may be formed as a dielectric multilayer film reflection mirror provided partially on the front face of the substrate 1 in place of the provision on the back face of the substrate 1 as depicted in FIG. 18. In other words, the lower reflection film 9 may be formed as a dielectric multilayer film reflection mirror that is provided at least between the substrate 1 and the light emitting layer 3 such that it contacts with part of a side face of the semiconductor nanowire 2 and besides a lower end portion of the light emitting layer 3 contacts with part of the front face of the dielectric multilayer film reflection mirror.

In this case, the lower end portion of the semiconductor nanowire 2 contacts with the front face of the substrate 1. In other words, the semiconductor nanowire 2 is provided on the substrate 1. In this case, the lower reflection film 9 is a partial reflection mirror that does not cover a lower end portion of the semiconductor nanowire 2 although it is provided at a lower end portion side of the semiconductor nanowire 2. Meanwhile, the upper reflection mirror 8 may be provided in such a manner as to cover at least an upper end portion of the light emitting layer 3. In this case, the upper end and the lower end of the light emitting layer 3 are insulated by the upper reflection mirror 8 and the lower reflection film 9 each configured from a dielectric multilayer film reflection mirror. Further, the n-side electrode 7 may be provided on the back face of the semiconductor substrate 1 and electrically coupled to an end portion of the semiconductor nanowire 2 through the semiconductor substrate 1. In this case, while a current injection structure wherein current is injected from the p-side electrode 6 and the n-side electrode 7 provided at the front face side and the back face side of the substrate 1, respectively, is implemented, a structure is implemented wherein the dielectric multilayer film reflection mirrors 8 and 9 with which a high reflectance is obtained with a small number of cycles are provided over and under the light emitting layer 3 at the front face side of the substrate and the spread of light in the substrate 1 can be suppressed. In this manner, in the configuration of the present sixth modification, the upper reflection mirror 8 is provided over upper end portions of the semiconductor nanowire 2, light emitting layer 3 and cladding layer 5. On the other hand, the lower reflection film 9 is provided merely under lower end portions of the light emitting layer 3 and cladding layer 5 but is not provided under a lower end portion of the semiconductor nanowire 2. Therefore, the configuration of the sixth modification can be used in a case in which the condition of the mode II is satisfied.

Figure 19A:
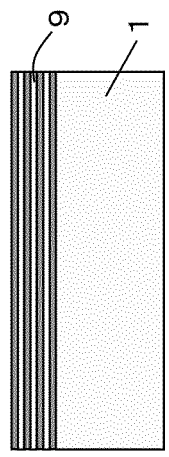
FIGS. 19A to 19D are schematic sectional views illustrating a fabrication method for the semiconductor laser according to the sixth modification to the present embodiment.
Figure 19B:
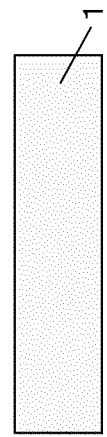
Figure 19C:
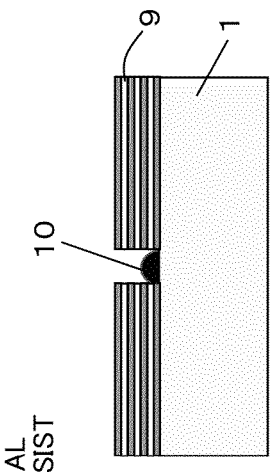
Figure 19D:
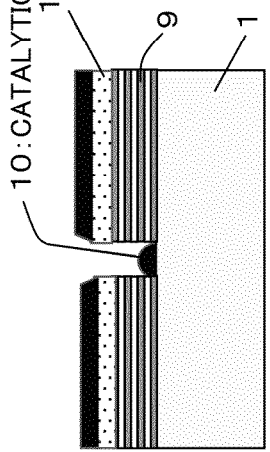
Figure 20:
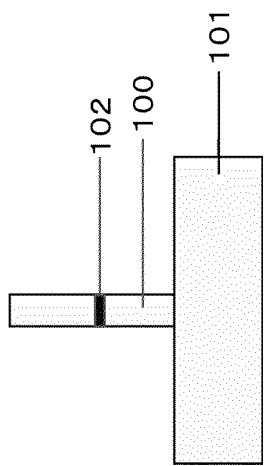
FIG. 20 is a schematic sectional view depicting a configuration of a semiconductor laser in which a conventional semiconductor nanowire is used.

In order to fabricate the semiconductor laser having the configuration of the sixth modification, the fabrication method of the embodiment described hereinabove may be modified such that it includes the following steps in place of the step of providing catalytic metal 10 and an insulating film 4A (4) on a substrate 1, namely, in place of the step of fabricating a semiconductor nanowire growing substrate. In particular, a dielectric multilayer film reflection mirror as the lower reflection film 9 is formed on a substrate 1, for example, as depicted in FIGS. 19A and 19B. Then, an opening is formed in a region of the dielectric multilayer film reflection mirror 9, in which a semiconductor nanowire 2 is to be grown, using resist 13 patterned on the dielectric multilayer film reflection mirror 9 as depicted in FIG. 19C, for example, using a lithography technology. Then, after the catalytic metal 10 is deposited, the resist 13 is removed to fabricate a semiconductor nanowire growing substrate including the catalytic metal 10 and the dielectric multilayer film reflection mirror 9 on the substrate 1 as depicted in FIG. 19D. It is to be noted that the succeeding steps can be performed similarly as in the case of the embodiment described hereinabove.

It is to be noted here that, although the modifications are described as modifications to the embodiment described hereinabove, also it is possible to combine them arbitrarily. For example, the first modification described hereinabove may be applied to the second to sixth modifications described hereinabove.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A semiconductor laser, comprising:
   a semiconductor nanowire of a first conductivity type provided over a substrate;
   a light emitting layer provided around the semiconductor nanowire and insulated at an upper end and a lower end thereof;
   a cladding layer of a second conductivity type different from the first conductivity type, the cladding layer being provided at an outer periphery of the light emitting layer;
   a first electrode electrically coupled to an end portion of the semiconductor nanowire;
   a second electrode electrically coupled to an outer periphery of the cladding layer;
   a first reflection mirror provided at a one-end portion side of the semiconductor nanowire; and
   a second reflection mirror provided at the other end portion side of the semiconductor nanowire,
   wherein a refractive index n1 of a semiconductor material configuring the semiconductor nanowire, a refractive index n2 of a semiconductor material configuring the light emitting layer and a refractive index n3 of a semiconductor material configuring the cladding layer satisfy a relationship of $n3<n1<n2$, and
   any one of a condition that a product $\Delta n \cdot \delta$ between a ratio $\Delta n = (n_2 - n_1)/n_1$ of a variation of the refractive index $n_2$ of the semiconductor material configuring the light emitting layer with respect to the refractive index n1 of the semiconductor material configuring the semiconductor nanowire and a ratio $\delta=(r_2-r_1)/r_1$ of a film thickness $(r_2-r_1)$ of the light emitting layer with respect to a radius $r_1$ of the semiconductor nanowire is equal to or higher than 0.003 and $r_1 \cdot \kappa_0$ is equal to or higher than 2.61, $\kappa_0$ being a wave number of the laser, a condition that $\Delta n \cdot \delta$ is equal to or higher than 0.007 and $r_1 \cdot \kappa_0$ is equal to or higher than 2.24, a condition that $\Delta n \cdot \delta$ is equal to or higher than 0.058 and $r_1 \cdot \kappa_0$ is equal to or higher than 1.046, a condition that $\Delta n \cdot \delta$ is equal to or higher than 0.075 and $r_1 \cdot \kappa_0$ is equal to or higher than 0.896, a condition that $\Delta n \cdot \delta$ is equal to or higher than 0.025 and $r_1 \cdot \kappa_0$ is equal to or higher than 2.61, a condition that $\Delta n \cdot \delta$ is equal to or higher than 0.031 and $r_1 \cdot \kappa_0$ is equal to or higher than 2.24, a condition that $\Delta n \cdot \delta$ is equal to or higher than 0.091 and $r_1 \cdot \kappa_0$ is equal to or higher than 1.046 and a condition that $\Delta n \cdot \delta$ is equal to or higher than 0.118 and $r_1 \cdot \kappa_0$ is equal to or higher than 0.896 is satisfied.

2. The semiconductor laser according to claim 1, wherein the first reflection mirror is provided over at least the one-end portion of the semiconductor nanowire and a one-end portion of the light emitting layer; and
the second reflection mirror is provided under at least the other end portion of the semiconductor nanowire and the other end portion of the light emitting layer.

3. The semiconductor laser according to claim 1, wherein the first reflection mirror is provided at least over a one-end portion of the light emitting layer; and
the second reflection mirror is provided at least under the other end portion of the light emitting layer.

4. The semiconductor laser according to claim 1, wherein the first reflection mirror is a multilayer film reflection mirror provided at a tip end side of the semiconductor nanowire; and
the second reflection mirror is a multilayer film reflection mirror or a metal film reflection mirror provided at the substrate side of the semiconductor nanowire.

5. The semiconductor laser according to claim 1, wherein the first reflection mirror is a dielectric multilayer film reflection mirror that covers at least the one end portion of the semiconductor nanowire and a one-end portion of the light emitting layer;
the substrate is a semiconductor substrate having the first conductivity type; and
the other end portion of the semiconductor nanowire contacts with a front face of the substrate;
the semiconductor laser further comprising an insulating film provided on the front face of the substrate and contacting with part of a side face of the semiconductor nanowire, part of a front face of the insulating film contacting with the other end portion of the light emitting layer.

6. The semiconductor laser according to claim 5, wherein the second reflection mirror and the first electrode are configured from a metal film provided at a back face of the substrate.

7. The semiconductor laser according to claim 5, wherein the second reflection mirror is a multilayer film reflection mirror provided at a back face of the substrate; and
the first electrode is provided at the front face of the substrate.

8. The semiconductor laser according to claim 1, wherein the first reflection mirror is a dielectric multilayer film reflection mirror covering at least the one-end portion of the semiconductor nanowire and a one-end portion of the light emitting layer;

the second reflection mirror is a conductive multilayer film reflection mirror provided at least between the substrate and the semiconductor nanowire and light emitting layer; and
the other end portion of the semiconductor nanowire contacts with a front face of the conductive multilayer film reflection mirror;
the semiconductor laser further comprising an insulating film provided on the front face of the conductive multilayer film reflection mirror and contacting with part of a side face of the semiconductor nanowire, part of a front face of the insulating film contacting with the other end portion of the light emitting layer.

9. The semiconductor laser according to claim 8, wherein the first electrode is provided on the front face of the conductive multilayer film reflection mirror.

10. The semiconductor laser according to claim 8, further comprising a conductive semiconductor layer provided on a surface of the substrate and coupled to the conductive multilayer film reflection mirror; wherein
the first electrode is provided on a surface of the conductive semiconductor layer.

11. The semiconductor laser according to claim 1, wherein the first reflection mirror is a dielectric multilayer film reflection mirror covering at least a one-end portion of the light emitting layer;
the second reflection mirror is a dielectric multilayer film reflection mirror provided at least between the substrate and the light emitting layer and contacting with part of a side face of the semiconductor nanowire, part of a front face of the dielectric multilayer film reflection mirror contacting with the other end portion of the light emitting layer;
the other end portion of the semiconductor nanowire contacts with the surface of the substrate; and
the first electrode is provided at a back face of the substrate.

12. The semiconductor laser according to claim 1, wherein the first reflection mirror and the second reflection mirror have a reflectance of 95% or more; and
the semiconductor nanowire has a length equal to or longer than 1 μm but equal to or shorter than 10 μm.

13. The semiconductor laser according to claim 1, wherein a semiconductor material configuring the semiconductor nanowire includes GaAs;
a semiconductor material configuring the light emitting layer includes InGaAs; and
a semiconductor material configuring the cladding layer includes AlGaAs.

14. The semiconductor laser according to claim 1, wherein a semiconductor material configuring the semiconductor nanowire includes InP;
a semiconductor material configuring the light emitting layer includes InGaAsP or InGaAs; and
a semiconductor material configuring the cladding layer includes InGaP.

15. The semiconductor laser according to claim 1, wherein the light emitting layer has a quantum well structure.

16. The semiconductor laser according to claim 15, wherein a semiconductor material configuring the semiconductor nanowire includes AlGaAs;
a semiconductor material of a well layer configuring the light emitting layer includes GaAs;
a semiconductor material of a barrier layer configuring the light emitting layer includes InGaAs; and
a semiconductor material configuring the cladding layer includes AlGaAs.

17. The semiconductor laser according to claim 15, wherein a semiconductor material configuring the semiconductor nanowire includes InP;
- a semiconductor material of a well layer configuring the light emitting layer includes InGaAs;
- a semiconductor material of a barrier layer configuring the light emitting layer includes InGaAsP; and
- a semiconductor material configuring the cladding layer includes InGaP.

* * * * *